(12) United States Patent
Morita et al.

(10) Patent No.: US 11,319,457 B2
(45) Date of Patent: May 3, 2022

(54) SUPPORT-PROVIDED INSULATING LAYER, LAMINATE, AND WIRING BOARD

(71) Applicant: HITACHI CHEMICAL COMPANY, LTD., Tokyo (JP)

(72) Inventors: Masaki Morita, Ibaraki (JP); Konatsu Nakamura, Ibaraki (JP); Shin Takanezawa, Ibaraki (JP)

(73) Assignee: SHOWA DENKO MATERIALS CO., LTD, Tokyo (JP)

( * ) Notice: Subject to any disclaimer, the term of this patent is extended or adjusted under 35 U.S.C. 154(b) by 0 days.

(21) Appl. No.: 16/365,237

(22) Filed: Mar. 26, 2019

(65) Prior Publication Data

US 2019/0218415 A1 Jul. 18, 2019

Related U.S. Application Data

(62) Division of application No. 13/816,206, filed as application No. PCT/JP2011/067984 on Aug. 5, 2011, now abandoned.

(30) Foreign Application Priority Data

Aug. 10, 2010 (JP) ................................ 2010-179754
Aug. 4, 2011 (JP) ................................ 2011-171338

(Continued)

(51) Int. Cl.
*B32B 27/16* (2006.01)
*B32B 27/18* (2006.01)
(Continued)

(52) U.S. Cl.
CPC ............ *C09D 163/00* (2013.01); *B32B 27/16* (2013.01); *B32B 27/18* (2013.01); *B32B 27/38* (2013.01);
(Continued)

(58) Field of Classification Search
CPC .... C09D 163/00; C09D 163/04; B32B 27/16; B32B 27/18; B32B 27/38; B32B 2457/08;
(Continued)

(56) References Cited

U.S. PATENT DOCUMENTS 5,733,823 A 3/1998 Sugioka et al.
5,987,739 A 11/1999 Lake
(Continued)

FOREIGN PATENT DOCUMENTS

EP 1153952 A1 11/2001
JP 07-116870 A 5/1995
(Continued)

OTHER PUBLICATIONS

The Extended European Search Report in European Application No. 11816378.1, dated Jan. 5, 2017.
(Continued)

*Primary Examiner* — Joanna Pleszczynska
(74) *Attorney, Agent, or Firm* — Fitch, Even, Tabin & Flannery, L.L.P.

(57) ABSTRACT

By producing a resin composition containing (A) an epoxy resin having two or more epoxy groups in one molecule thereof and containing a hexanediol structure, (B) an ultraviolet ray active ester group-containing compound, and (C) an epoxy resin curing accelerator, even in a state where an irregular shape of the surface of an insulating resin layer is small, a high adhesive force to a wiring conductor can be easily revealed.

19 Claims, 2 Drawing Sheets

(30) Foreign Application Priority Data

Aug. 4, 2011 (JP) ................................ 2011-171339
Aug. 4, 2011 (JP) ................................ 2011-171340

(51) Int. Cl.

| | |
|---|---|
| *B32B 27/38* | (2006.01) |
| *C09D 163/00* | (2006.01) |
| *C09D 163/04* | (2006.01) |
| *C08G 59/22* | (2006.01) |
| *C08G 59/24* | (2006.01) |
| *C08G 59/42* | (2006.01) |
| *C08G 59/68* | (2006.01) |
| *C08L 63/00* | (2006.01) |
| *H05K 1/03* | (2006.01) |
| *C08G 59/38* | (2006.01) |
| *H05K 3/46* | (2006.01) |

(52) U.S. Cl.
CPC ............. *C08G 59/22* (2013.01); *C08G 59/24* (2013.01); *C08G 59/38* (2013.01); *C08G 59/4223* (2013.01); *C08G 59/4276* (2013.01); *C08G 59/68* (2013.01); *C08L 63/00* (2013.01); *H05K 1/0306* (2013.01); *H05K 1/0353* (2013.01); *B32B 2457/08* (2013.01); *H05K 3/46* (2013.01)

(58) Field of Classification Search
CPC ........ H05K 1/03; H05K 1/0313; C08G 59/22; C08G 59/24
See application file for complete search history.

(56) References Cited

U.S. PATENT DOCUMENTS

| | | |
|---|---|---|
| 2003/0178227 A1 | 9/2003 | Matsunaga et al. |
| 2009/0017286 A1 | 1/2009 | Maeda et al. |
| 2009/0288870 A1 | 11/2009 | Kondo et al. |
| 2011/0036625 A1 | 2/2011 | Narnhashi et al. |
| 2011/0217512 A1 | 9/2011 | Heishi et al. |

FOREIGN PATENT DOCUMENTS

| | | |
|---|---|---|
| JP | 2003-252958 A | 9/2003 |
| JP | 2004-214597 A | 1/2005 |
| JP | 2005-5319 A | 1/2005 |
| JP | 2009-144052 A | 7/2009 |
| JP | 2009-286889 A | 12/2009 |
| WO | 2010024391 A1 | 3/2010 |

OTHER PUBLICATIONS

JP 07-116870A, Kamata, Machine Translation, originally published 1995, p. 1-26.
International Search Report issued from the International Bureau in the corresponding International Application No. PCT/JP2011/067984, dated Jan. 17, 2012, 7 pages.
Office Action dated Apr. 14, 2017, for Korean Patent Application No. 10-2013-7002993.

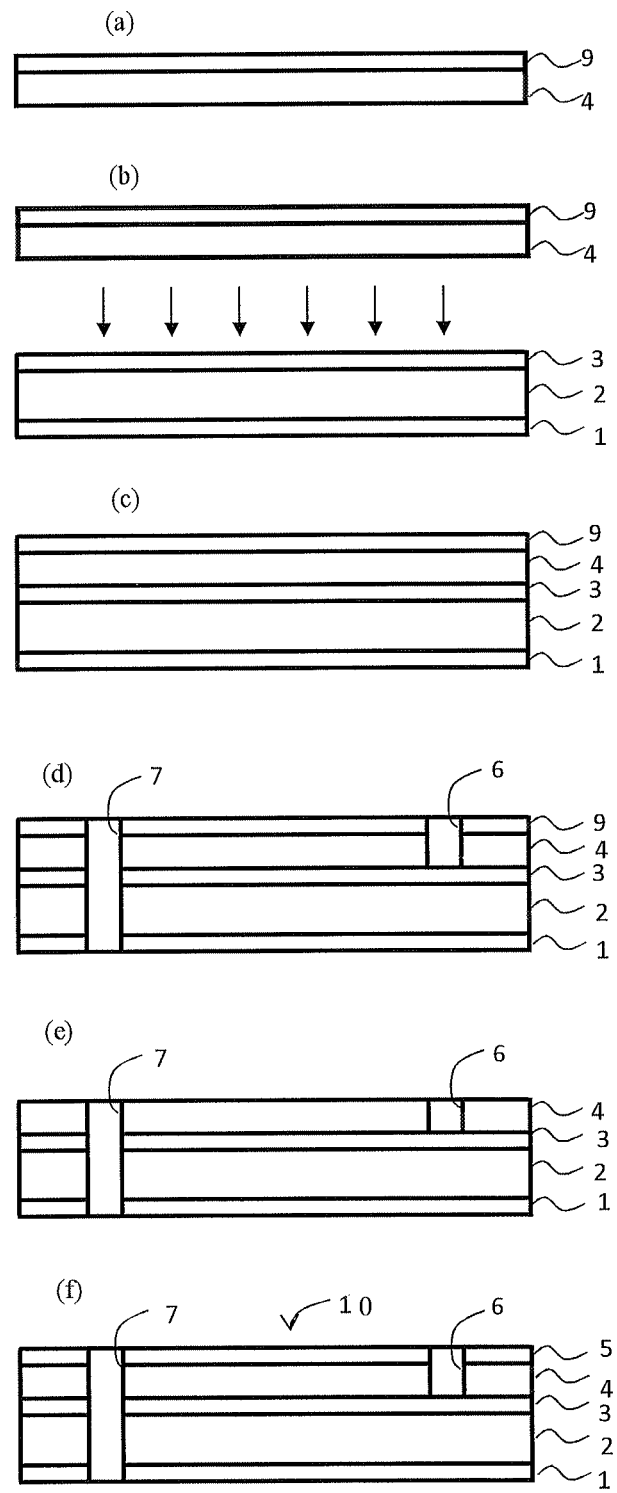

[FIG.2]
(a)
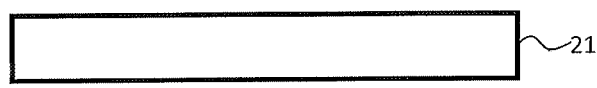
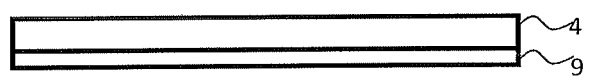
(b)
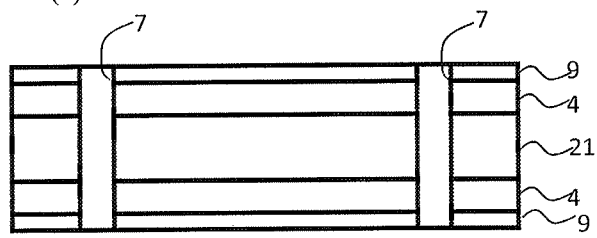
(c)
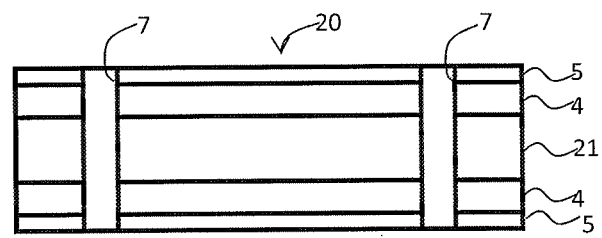

SUPPORT-PROVIDED INSULATING LAYER, LAMINATE, AND WIRING BOARD

CROSS-REFERENCE TO RELATED APPLICATIONS

This application is a divisional of U.S. application Ser. No. 13/816,206, filed in the U.S. on Mar. 18, 2013, which is a National Stage Application under 35 U.S.C. § 371 of International Application No. PCT/JP2011/067984, filed Aug. 5, 2011, designating the United States, which claims priority from Japanese Patent Application No. 2011-171338, filed Aug. 4, 2011, Japanese Patent Application No. 2011-171339, filed Aug. 4, 2011, Japanese Patent Application No. 2011-171340, filed Aug. 4, 2011, and Japanese Patent Application No. 2010-179754, filed Aug. 10, 2010, the entire content of each of which is hereby incorporated herein by reference.

TECHNICAL FIELD

The present invention relates to a resin composition, a cured resin product, a wiring board, and a method for manufacturing a wiring board. In more detail, the present invention relates to an insulating resin capable of revealing a high adhesive force to a wiring conductor even in a state where an irregular shape of the surface of an insulating resin layer is small, and also to a wiring board and a method for manufacturing a wiring board.

BACKGROUND ART

Miniaturization, weight reduction and multifunctionalization of electronic instruments make remarkable progress. Following this, high integration of LSI, chip parts, and the like makes progress, and forms thereof are rapidly changed to a multi-pin system or a miniaturized system. Therefore, in order to enhance a mounting density of electronic parts, the development of a wiring board capable of coping with fine wiring is advanced. As such wiring boards, there is a wiring board of a build-up system in which a glass cloth-free insulating resin is used in place of a prepreg, and only a necessary portion is subjected to interlayer connection with a via hole to form a wiring layer, and such a system is becoming the main stream as a technique suitable for weight reduction, miniaturization and fining.

In this wiring board of a build-up system, first of all, an insulating resin layer is formed on a substrate having a circuit. Then, after curing the insulating resin layer, in order to ensure the adhesive force to a wiring conductor, the surface of an insulating resin layer is subjected to a roughening treatment upon being dipped in an oxidizing treatment liquid. Subsequently, a plating pre-treatment is performed to achieve electroless plating. Furthermore, a resist pattern is formed on an electroless plated layer; thick deposition is performed by means of electrolytic plating; the resist pattern is peeled off; and the electroless plated layer is then removed to form a wiring board.

However, following fining of the wiring, irregularities of the surface of the insulating resin layer formed by roughening the surface of the insulating resin layer become a cause of lowering of the yield of wiring formation. A reason for this resides in the matter that the electroless metal plated layer bites into the irregularities of the surface of the insulating resin layer and remains without being removed at the time of etching, thereby causing a short circuit of the wiring, or the formation accuracy of the resist pattern is lowered due to the irregularities of the surface of the insulating resin layer.

In consequence, it is important for realizing fine wiring to make the irregularities of the surface of the insulating resin layer small. However, when the irregularities become small, an adhesive force between the insulating resin layer and the electroless metal plated layer is lowered, and therefore, it was needed to solve this problem. In addition, as the oxidizing treatment liquid which is used for forming the irregularities on the surface of the insulating resin layer, a strong alkali liquid containing sodium permanganate and sodium hydroxide is in general used. Though sodium permanganate dissolves a resin therein in the presence of a strong alkali, heptavalent manganese is consumed by an oxidizing treatment, and therefore, it is needed to regenerate manganese by an electrolytic regeneration system. In order to ensure insulation reliability or heat resistance, usual insulating resins are designed so as to increase the resistance to a roughening liquid. Therefore, in order to stably perform the roughening treatment, the control of manganese is important. But, since the dissolved resin floats in the treatment liquid, electrolytic regeneration of manganese is not in time, and necessity for frequently performing initial make-up of electrolytic bath is generated. These result in causing an increase in costs or a lowering of productivity because an additional step such as a water washing treatment or a liquid-waste treatment is added.

As described above, the insulating resin layer which is used for the wiring board of a build-up system is required to be able to ensure an adhesive force even if the irregularities are small.

In response to such a requirement, there have been made a variety of proposals. For example, Patent Document 1 proposes a method in which after irradiating an insulating resin layer using a polyphenylene ether resin with ultraviolet rays in the presence of oxygen to provide a conductor layer, the conductor layer is subjected to a heat treatment, and a circuit is then formed on the conductor layer, or a circuit is formed, and a heat treatment is then performed (see Patent Document 1, claim 1). According to the subject technology, it is disclosed that a surface roughness of the insulating layer can be controlled to be small; and that adhesion between the insulating layer and the conductor layer can be made favorable (see Patent Document 1, paragraph [0006]).

In addition, Patent Document 2 discloses a technology for treating an insulating resin layer with ultraviolet rays in an ozone solution. According to the subject technology, it is disclosed that excessive impartment of a plating catalyst to the surface of an insulating layer can be suppressed while ensuring an adhesion force between a wiring and an insulating layer; and that the deterioration of insulation resistance between the wirings can be suppressed (see Patent Document 2, claim 1 and paragraph [0006]).

PRIOR ART DOCUMENTS

Patent Documents

[Patent Document 1] JP-A-2004-214597
[Patent Document 2] JP-A-2005-5319

SUMMARY OF THE INVENTION

Problems to be Solved by the Invention

[1] According to the technology disclosed in the foregoing Patent Document 1, it is described that the surface roughness of the insulating layer can be controlled to be small; and that the adhesion between the insulating layer and the conductor layer can be made favorable. However, the strength of an adhesive force at the time of roughening treatment is not specifically disclosed, and a degree of its effect is unclear. In addition, the polyphenylene ether resin which is used as the insulating resin in Patent Document 1 involves a problem in view of manufacture such that a xenon excimer lamp or a low pressure mercury vapor lamp each having a wavelength of not more than 300 nm, which is different from an ultraviolet ray lamp usually used for many purposes for post-exposure of a solder resist, or the like, cannot help being used.

In addition, in the technology disclosed in Patent Document 2, the insulating resin composition is not mentioned at all, and therefore, a degree of its effect is unclear. In addition, a step of dipping in an ozone solution having an ozone concentration of 100 ppm or more is substantially essential, so that there is involved such a problem that the operation is complicated.

Under such circumstances, the present invention has been made, and a first object thereof is to provide a resin composition which has a high adhesive force to a wiring conductor even in a state where an irregular shape of the surface of an insulating resin layer is small and in which even when allowed to stand at a high temperature for a long period of time, the insulating resin layer keeps a high adhesive force to the wiring conductor, a cured resin product obtained by curing the resin composition, a wiring board using the cured resin product, and a method for manufacturing the wiring board.

[2] In addition, according to the technologies of Patent Documents 1 to 2, it is difficult to remove a smear within a hole such as a via hole (a hole for connecting patterns to each other), a part insertion hole (a hole for connection by inserting a part lead), etc. while making irregularities of the surface of the insulating resin.

That is, when a hole is provided in the insulating resin layer on a substrate, a smear is generated within the hole. Conventionally, a desmearing treatment within this hole was performed at the time of the foregoing roughening treatment of the surface of the insulating resin layer with a roughening liquid.

However, in the case of performing the irradiation with ultraviolet rays in place of the treatment of irregularities with a sodium permanganate based roughening liquid as in Patent Documents 1 and 2, the desmearing treatment within the hole with the roughening liquid is omitted, too. As a result, it may be impossible to sufficiently remove the smear within the hole.

Under such circumstances, the present invention has been made, and a second object thereof is to provide a method for manufacturing a wiring board, which is capable of obtaining a wiring board in which nevertheless irregularities of the surface of an insulating resin layer are small, not only an adhesive force of the insulating resin layer to a wiring conductor is high, but a smear within a hole is sufficiently removed.

Means for Solving the Problems

[1] In order to achieve the foregoing first object, the present inventors made extensive and intensive investigations. As a result, it has been found that the foregoing first object can be achieved by using a resin composition containing an epoxy resin having a specified structure, an ultraviolet ray active ester group-containing compound, and an epoxy resin curing accelerator.

In addition, it has been found that the objective wiring board is efficiently obtained by providing an uncured resin layer on a substrate having a circuit by using the resin composition, thermally curing the uncured resin layer, and then irradiating this with ultraviolet rays to obtain an insulating resin layer, followed by forming a wiring thereon by a plating method.

A first invention has been accomplished on the basis of such knowledge.

Specifically, the first invention provides:
(1) A resin composition containing (A) an epoxy resin having two or more epoxy groups in one molecule thereof and having a structural unit derived from an alkylene glycol having a carbon number of from 3 to 10 in a main chain thereof, (B) an ultraviolet ray active ester group-containing compound, and (C) an epoxy resin curing accelerator;
(2) The resin composition as set forth above in (1), wherein the alkylene glycol having a carbon number of from 3 to 10 is hexanediol;
(3), A cured resin product obtained by thermally curing the resin composition as set forth above in (1) or (2) and irradiating with ultraviolet rays;
(4) A wiring board obtained by disposing a cured resin layer composed of the cured resin product as set forth above in (3) on a substrate having a circuit of a wiring conductor and forming a wiring on the cured resin layer by plating; and
(5) A method for manufacturing a wiring board including (a) a step of forming an uncured resin layer on a substrate having a circuit of a wiring conductor by using the resin composition as set forth above in (1) or (2), (b) a step of thermally curing the uncured resin layer and subsequently irradiating with ultraviolet rays to form a cured resin layer, and (c) a step of subjecting the cured resin layer to an electroless plating treatment.

Incidentally, since the cured resin layer in the first invention has insulating properties, there may be the case where it is hereunder called an "insulating resin layer".

[2] In order to achieve the foregoing second object, the present inventors made extensive and intensive investigations. As a result, they have obtained the following knowledge.

Specifically, it has been found that the occurrence of an increase of irregularities of the surface of an insulating resin layer can be prevented by protecting the surface of the insulating resin layer by a support at the time of a desmearing treatment within a hole and then removing the support.

Incidentally, there is involved such a problem that if irregularities are not formed (roughened) on the surface of the insulating resin layer at the time of a desmearing treatment in this way, there is a concern that an adhesive force of the surface of the insulating resin layer to a wiring is insufficient. It has been found that this problem can be solved by irradiating the surface of the insulating resin layer with ultraviolet rays to enhance the adhesive force to the wiring and then forming the wiring on the surface of this insulating resin layer.

A second invention has been accomplished on the basis of such knowledge.

Specifically, the second invention provides:
(6) A method for manufacturing a wiring board having an insulating resin layer and a wiring formed on the surface of the insulating resin layer, which performs successively a laminate forming step of forming a laminate having the insulating resin layer and a support, a hole forming step of providing a hole in the laminate, a desmearing treatment step of removing a smear within the hole with a desmearing treatment liquid, a support removal step of removing the support from the laminate, and a wiring forming step of forming the wiring on the surface of the insulating resin layer from which the support has been removed, wherein an ultraviolet ray irradiation step of irradiating ultraviolet rays on the surface of the insulating resin layer from which the support has been removed, to enhance an adhesive force to the wiring is included after the laminate forming step and before, the wiring forming step;

(7) The method for producing a wiring board as set forth above in (6), which performs successively a laminate forming step of forming a laminate having a support and an insulating resin layer, a hole forming step of providing a hole in the laminate, a desmearing treatment step of removing a smear within the hole with a desmearing treatment liquid, a support removal step of removing the support from the laminate, an ultraviolet ray irradiation step of irradiating ultraviolet rays on the insulating resin layer from the support side of the laminate, and a wiring forming step of forming the wiring on the surface of the insulating resin layer from which the support has been removed;

(8) The method for producing a wiring board as set forth above in (6), which performs successively a laminate forming step of forming a laminate having a support and an insulating resin layer, a hole forming step of providing a hole in the laminate, an ultraviolet ray irradiation step of irradiating ultraviolet rays on the insulating resin layer from the support side of the laminate, a desmearing treatment step of removing a smear within the hole with a desmearing treatment liquid, a support removal step of removing the support from the laminate, and a wiring forming step of forming the wiring on the surface of the insulating resin layer from which the support has been removed; and (9) The method for producing a wiring board as set forth above in (6), which performs successively a laminate forming step of forming a laminate having a support and an insulating resin layer, a hole forming step of providing a hole in the laminate, a desmearing treatment step of removing a smear within the hole with a desmearing treatment liquid, an ultraviolet ray irradiation step of irradiating ultraviolet rays on the insulating resin layer from the support side of the laminate, a support removal step of removing the support from the laminate, and a wiring forming step of forming the wiring on the surface of the insulating resin layer from which the support has been removed.

Effects of the Invention

[1] According to the first invention, it is possible to provide a resin composition which reveals a high adhesive force to a wiring conductor even in a state where an irregular shape of the surface of an insulating resin layer is small and in which even when treated with a sodium permanganate based roughening liquid or the like for the purpose of removing a smear on the bottom of a via hole, not only a roughened irregular shape of the surface of the insulating resin layer is small, but a high adhesive force to the wiring conductor can be kept, a wiring board, and a method for manufacturing a wiring board.

[2] According to the second invention, it is possible to obtain a wiring board in which nevertheless irregularities of the surface of an insulating resin layer are small, not only an adhesive force of the insulating resin layer to a wiring conductor is high, but a smear within a via hole is sufficiently removed.

BRIEF DESCRIPTION OF THE DRAWINGS

FIG. 1 is a cross-sectional view explaining an example of a manufacturing method of a wiring board according to the second invention.

FIG. 2 is a cross-sectional view explaining another example of a manufacturing method of a wiring board according to the second invention.

MODES FOR CARRYING OUT THE INVENTION

[1] First, Invention

The resin composition of the first invention contains (A) an epoxy resin having two or more epoxy groups in one molecule thereof and having a structural unit derived from an alkylene glycol having a carbon number of from 3 to 10 in a main chain thereof, (B) an ultraviolet ray active ester group-containing compound, and (C) an epoxy resin curing accelerator.

[Resin Composition]

((A) Epoxy Resin)

In the resin composition of the first invention, the epoxy resin which is used as the component (A) may be an epoxy resin having two or more epoxy groups in one molecule thereof and having a structural unit derived from an alkylene glycol having a carbon number of from 3 to 10 in a main chain thereof. Examples thereof include a cresol novolak type epoxy resin, a phenol novolak type epoxy resin, a naphthol novolak type epoxy resin, a biphenyl novolak type resin, a bisphenol A type epoxy resin, a bisphenol F type epoxy resin, a bisphenol S type epoxy resin, a bisphenol T type epoxy resin, a bisphenol Z type epoxy resin, a tetrabromobisphenol A type epoxy resin, a biphenyl type epoxy resin, a biphenyl aralkyl type epoxy resin, a tetramethylbiphenyl type epoxy resin, a triphenyl type epoxy resin, a tetraphenyl type epoxy resin, a naphthol aralkyl type epoxy resin, a naphthalenediol aralkyl type epoxy resin, a naphthol aralkyl type epoxy resin, a fluorene type epoxy resin, an epoxy resin having a dicyclopentadiene skeleton, an epoxy resin having an ethylenically unsaturated group in a skeleton thereof, an epoxy resin having ethanediol in a skeleton thereof, an epoxy resin having propanediol in a skeleton thereof, an epoxy resin having butanediol in a skeleton thereof, an epoxy resin having pentanediol in a skeleton thereof, an epoxy resin having hexanediol in a skeleton thereof, an epoxy resin having heptanediol in a skeleton thereof, an epoxy resin having octanediol in a skeleton thereof, an alicyclic type epoxy resin, and the like, with an epoxy resin containing a hexanediol structure being preferable.

From the viewpoints of insulation reliability and heat resistance, these epoxy resins may also be used in combination of two or more kinds thereof.

The alkylene glycol having a carbon number of from 3 to 10 is more preferably an alkylene glycol having a carbon number of from 4 to 8, and especially preferably hexanediol.

So far as the component (A) is, for example, a bisphenol A type epoxy resin having a structural unit derived froth hexanediol in a main chain thereof, it is one represented by the following chemical formula (I).

(I)

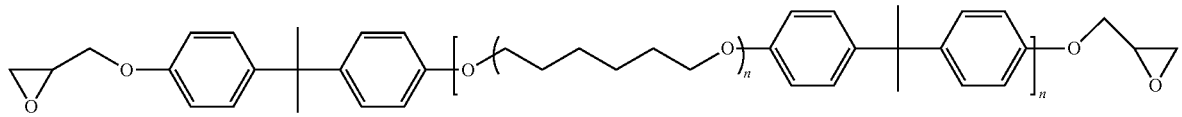

Each of m and n is an integer expressing a repeating unit number.

((B) Ultraviolet Ray Active Ester Group-Containing Compound)

In the resin composition of the first invention, the ultraviolet ray active ester group-containing compound as the component (B) is a compound having an ester group which is activated upon irradiation with ultraviolet rays and is a component which can also be used as a curing agent of the epoxy resin as the component (A). More specifically, the ultraviolet ray active ester group-containing compound is a compound containing one or more ester groups in one molecule thereof, not containing a hydroxyl group, and being capable of curing an epoxy resin, and examples thereof include ester compounds obtained from an aliphatic or aromatic carboxylic acid and an aliphatic or aromatic hydroxy compound, and the like. Of these, when an ester compound constituted of an aliphatic carboxylic acid, an aliphatic hydroxy compound, or the like contains an aliphatic chain, it is able to increase solubility in an organic solvent or compatibility with an epoxy resin. On the other hand, when an ester compound constituted of an aromatic carboxylic acid, an aromatic hydroxy compound, or the like has an aromatic ring, it is able to enhance heat resistance of the resin composition.

Suitable examples of the ultraviolet ray active ester group-containing compound include aromatic esters obtained by using, as a raw material, a mixture of an aromatic carboxylic acid, a monohydric phenol based compound, and a polyhydric phenol based compound and subjecting the aromatic carboxylic acid and the phenolic hydroxyl groups of the monohydric based compound and the polyhydric phenol based compound to a condensation reaction.

Examples of the aromatic carboxylic acid include compounds in which from 2 to 4 hydrogen atoms of the aromatic ring of benzene, naphthalene, biphenyl, diphenylpropane, diphenylmethane, diphenyl ether, diphenylsulfone, benzophenone, or the like are substituted with a carboxy group. Examples of the monohydric phenol based compound include compounds in which one hydrogen atom of the foregoing aromatic ring is substituted with a hydroxyl group. Examples of the polyhydric phenol based compound include compounds in which from 2 to 4 hydrogen atoms of the foregoing aromatic ring are substituted with a hydroxyl group.

In detail, examples of the aromatic carboxylic acid include phthalic acid, isophthalic acid, terephthalic acid, benzenetricarboxylic acid, and the like. Examples of the monohydric phenol based compound include phenol, a variety of cresols, α-naphthol, β-naphthol, and the like. Examples of the polyhydric phenol based compound include hydroquinone, resorcin, catechol, 4,4'-biphenol, 4,4'-dihydroxydiphenyl ether, bisphenol A, bisphenol F, bisphenol S, bisphenol Z, brominated bisphenol A, brominated bisphenol F, brominated bisphenol S, methylated bisphenol S, a variety of dihydroxynaphthalenes, a variety of dihydroxybenzophenones, a variety of trihydroxybenzophenones, a variety of tetrahydroxybenzophenones, fluoroglycine, and the like.

The ultraviolet ray active ester group-containing compound may also be a resin having one or more ester groups in one molecule thereof and is available as a commercial product. Examples thereof include "EXB-9460", "EXB-9460S", "EXB-9470", "EXB-9480", and "EXB-9420", all of which are manufactured by DIC Corporation; "BPN80", manufactured by Mitsui Chemicals, Inc.; and the like.

These ultraviolet ray active ester group-containing compounds may be used solely, or may be used in combination of two or more kinds thereof.

The ultraviolet ray active ester group-containing compound as the component (B) in the resin composition of the first invention is preferably contained in an amount of from 0.75 to 1.25 equivalents relative to one epoxy equivalent of the epoxy resin (A). When the amount of the ultraviolet ray active ester group-containing compound as the component (B) is 0.75 equivalents or more, tack properties or curing properties are sufficient, whereas when it is not more than 1.25 equivalents, sufficient curing properties, heat resistance, and chemical resistance are obtained.

((C) Epoxy Resin Curing Accelerator)

In the resin composition of the first invention, the epoxy resin curing accelerator as the component (C) is not particularly limited, and general curing accelerators which are used for curing of epoxy resins can be used.

As specific examples of the curing accelerator, there can be exemplified imidazole based compounds such as 2-methylimidazole, 2-ethyl-4-methylimidazole, 1-benzyl-2-methylimidazole, 2-heptadecylimidazole, 2-undecylimidazole, 1-cyanoethyl-2-phenylimidazolium trimellitate, etc.; organic phosphine based compounds such as triphenylphosphine, tributylphosphine, etc.; organic phosphite based compounds such as trimethyl phosphite, triethyl phosphite, etc.; phosphonium salt compounds such as ethyltriphenylphosphonium bromide, tetraphenylphosphonium tetraphenyl borate, etc.; trialkylamines such as triethylamine, tributylamine, etc., amine based compounds such as 4-dimethylaminopyridine, benzyldimethylamine, 2,4,6-tris(dimethylaminomethyl)phenol, 1,8-diazabicyclo(5.4.0)-undecene-7 (hereinafter abbreviated as "DBU"), etc.; a salt of DBU and terephthalic acid or 2,6-naphthalenedicarboxylic acid, etc.; quaternary ammonium salt compounds such as tetraethylammonium chloride, tetrapropylammonium chloride, tetrabutylammonium chloride, tetrabutylammonium bromide, tetrahexylammonium bromide, benzyltrimethylammonium chloride, etc.; and the like. These may be used solely, or may be used in combination of two or more kinds thereof.

In addition, a content of the curing accelerator in the resin composition of the first invention is preferably from 0.02 to 1.5 parts by mass based on 100 parts by mass of the epoxy resin as the component (A). When the content of the curing accelerator is 0.02 parts by mass or more, curing of the epoxy resin is sufficient, and heat resistance can be kept, whereas when it is not more than 1.5 parts by mass, storage stability of the resin composition and handling properties of a B-stage resin composition are favorable. From these viewpoints, the content of the curing accelerator (C) is more preferably in the range of from 0.8 to 1.3 parts by mass.

The resin composition of the first invention containing the foregoing components (A) to (C) can be formed into a cured resin product by thermally curing it and irradiating with ultraviolet rays and developed into a variety of applications. Specifically, for example, a wiring board can be obtained by disposing a cured resin layer composed of the cured resin product on a substrate having a circuit of a wiring conductor, to prepare a cured insulating resin layer and forming a wiring on the resin layer by means of plating, as described later.

In the thus obtained cured resin layer (insulating resin layer), nevertheless the irregular shape of the surface of the insulating resin layer is small, a high adhesive force to the wiring conductor is revealed, as described above.

Though its mechanism is not always elucidated yet, it may be conjectured that by irradiating the insulating resin layer with ultraviolet rays, the ester group or groups of the ultraviolet ray active ester group-containing compound as the component (B) is/are decomposed to form an oxygen-containing group on the surface of the insulating resin layer, and this oxygen-containing group brings about a high adhesive force to the wiring conductor. Incidentally, an amount of the oxygen atom of the oxygen-containing group formed on the surface of the insulating resin can be measured by the X-ray photoelectron spectroscopy.

Next, as for an ultraviolet ray irradiation condition, it is desirable to use an ultraviolet ray lamp capable of undergoing radiation at a maximum wavelength in the range of from 300 to 450 nm and to irradiate ultraviolet rays in an amount of light of from about 1,000 to 5,000 mJ/cm$^2$, and preferably from 3,000 to 4,000 mJ/cm$^2$ under an atmospheric pressure atmosphere.

Incidentally, the foregoing amount of light (mJ/cm$^2$) is expressed by "illuminance (mW/cm$^2$)×irradiation time (sec)". In addition, a condition of the foregoing thermal curing is described later.

In this way, by subjecting the insulating resin layer to a thermal curing treatment and then an ultraviolet ray irradiation treatment, even if an irregular shape by using a conventionally used a sodium permanganate based roughening liquid or other roughening liquid is not formed, a high adhesive force to the wiring conductor may be revealed. Therefore, not only a lowering of the yield of the wiring formation can be suppressed, but a water washing treatment or a liquid-waste treatment due to the use of a roughening liquid can be omitted, and this is advantageous in view of costs.

In addition, even when the treatment with a sodium permanganate based roughening liquid or other roughening liquid is performed for the purpose of removing a smear on the bottom of a via hole, not only the roughened irregular shape is small, but a high adhesive force to the wiring conductor can be ensured.

Incidentally, a temperature of the insulating resin layer at the time of ultraviolet ray irradiation is preferably from about 50 to 80° C., and more preferably from 60 to 70° C.

In the resin composition of the first invention, an inorganic filler, or various additive components, for example, a leveling agent, an antioxidant, a flame retardant, a thixotropy-imparting agent, a thickener, a solvent, etc., can be contained as the need arises, within the range where the object of the first invention is not impaired.

[Inorganic Filler]

The inorganic filler is contained for the purpose of suppressing the coefficient of thermal expansion or increasing the coating film strength, and for example, a material selected among silica, fused silica, talc, alumina, aluminum hydroxide, barium sulfate, calcium hydroxide, Aerosil, and calcium carbonate can be used. These may be used solely, or may be used in combination of two or more kinds thereof. Incidentally, it is preferable to use silica in view of dielectric characteristic or low thermal expansion. A content of the inorganic filler is preferably from 5 to 35% by volume, and more preferably from 10 to 30% by volume in a solids content of the resin composition exclusive of the solvent. When the content of the inorganic filler is 5% by volume or more, the increases of the coefficient of thermal expansion and the dielectric loss can be suppressed, whereas when it is not more than 35% by volume, a necessary flow at the time of forming an insulating resin in an inner layer circuit is sufficient so that an unfilled area is hardly generated.

For the purpose of increasing the dispersibility, such an inorganic filler may be treated with a coupling agent, and it may be homogeneously dispersed in the resin composition by means already-known kneading with a kneader, a ball mill, a bead mill, three rollers, or the like.

(Coupling Agent)

For the purpose of increasing the dispersibility of the inorganic filler, examples of the coupling agent which is used for a surface treatment of the inorganic filler include silane based, titanate based, or aluminum based coupling agents, and the like. Of these, silane based coupling agents are preferable. Examples thereof include aminosilane compounds such as N-phenyl-γ-aminopropyltrimethoxysilane, γ-aminopropyltrimethoxysilane, γ-aminopropyltriethoxysilane, γ-(2-aminoethyl)aminopropyltrimethoxysilane, γ-(2-aminoethyl)aminopropyltriethoxysilane, γ-anilinopropyltrimethoxysilaane, γ-anilinopropyltriethoxysilane, N-β-(N-vinylbenzylaminoethyl)-γ-aminopropyltrimethoxysilan e, N-β-(N-vinylbenzylaminoethyl)-γ-aminopropyltriethoxysilane, etc.; epoxysilane compounds such as γ-glycidoxypropyltrimethoxysilane, γ-glycidoxypropyltriethoxysilane, β-(3,4-epoxycyclohexyl)ethyltrimethoxysilane, etc.; and besides, γ-glycidoxypropyltrimethoxysilane, γ-glycidoxypropylvinylethoxysilane, γ-mercaptopropyltrimethoxysilane, γ-mercaptopropyltriethoxysilane, γ-ureidopropyltrimethoxysilane, γ-ureidopropyltriethoxysilane, γ-methacryloxypropyltrimethoxysilane, and the like.

[Solvent]

The resin composition of the first invention can be used upon being diluted with a solvent. As the solvent, for example, there are exemplified methyl ethyl ketone, xylene, toluene, acetone, ethylene glycol monoethyl ether, cyclohexanone, ethyl ethoxypropionate, N,N-dimethylformamide, N,N-dimethylacetamide, propylene glycol monomethyl ether, and the like. These may be used solely, or may be used in admixture of two or more kind thereof. A use proportion of this solvent relative to the foregoing resin composition may be a conventionally used proportion, and the use amount can be adjusted in conformity with the equipment for forming a coating film of the insulating resin as desired.

[Preparation of Resin Composition]

A preparation method of the resin composition of the first invention is not particularly limited, and a conventionally known preparation method can be adopted.

For example, the resin composition of the first invention can be prepared as a varnish by not only adding the epoxy resin as the component (A), the ultraviolet ray active ester group-containing compound as the component (B), and the epoxy resin curing accelerator as the component (C) in the foregoing solvent but adding an inorganic filler or various additive components to be used as the need arises, and then mixing and stirring the contents using a mixing machine of every kind inclusive of an ultrasonic dispersion system, a high-pressure collision dispersion system, a high-speed rotating dispersion system, a bead mill system, a high-speed shearing dispersion system, an autorotation revolution dispersion system, and the like.

From the viewpoints of coating properties and the like, a solids content concentration in this varnish exclusive of the solvent is preferably from 20 to 70% by mass.

[Wiring Board]

The wiring board of the first invention is a wiring board obtained by forming an uncured resin layer on a substrate having a circuit of a wiring conductor by using the foregoing resin composition, thermally curing this, and then irradiating with ultraviolet rays to obtain a cured insulating resin layer, followed by forming a wiring thereon by means of plating.

(Fabrication of Insulating Resin Layer-Provided Carrier Film)

In the wiring board of the first invention, in order to form an insulating resin layer on a substrate having a circuit of a wiring conductor, first of all, a resin composition (varnish) is coated on a carrier film and then subjected to a drying treatment at a temperature of from about 80 to 180° C. for from 1 to 10 minutes, to fabricate an insulating resin layer-provided carrier film. In the case where not only the temperature of the drying treatment is 80° C. or higher, but the time is one minute or longer, the drying sufficiently proceeds, and the generation of a void within the insulating resin layer can be suppressed, and hence, such is preferable. On the other hand, when not only the temperature of the drying treatment is not higher than 180° C., but the time is not longer than 10 minutes, the occurrence of a lowering of the resin flow amount to be caused due to excessive progress of drying can be suppressed, and hence, such is preferable. The resin composition (varnish) coated on the carrier film is in an uncured state where the solvent in the varnish is vaporized due to drying, and a curing treatment is not performed.

From the viewpoint of insulating properties, a thickness (thickness after drying) of the insulating resin layer is preferably a minimum film thickness at which a minimum insulation distance can be ensured or more. Though this minimum insulation distance varies with a composition of the insulating resin, in general, it is preferably 3 μm or more. Though in view of insulating properties, it is advantageous to make the film thickness of the insulating resin layer thick, from the viewpoint of economy, it is preferable that the film thickness of the insulating resin layer is usually not more than about 60 μm.

Though a thickness of the carrier film is not particularly limited, it is preferably from about 10 to 200 μm, and more preferably from 20 to 100 μm. In addition, as the carrier film, a polyethylene terephthalate (PET) film is frequently used, and a PET film, a surface of which has been subjected to a release agent treatment, may also be used.

(Substrate Having Circuit of Wiring Conductor (Circuit-Provided Insulating Substrate))

The substrate having a circuit of a wiring conductor to be used for the wiring board of the first invention (hereinafter also referred to as "circuit-provided insulating substrate") is not particularly limited so far as it is an insulating substrate which is provided with a circuit on at least one surface thereof, and it may be an insulating substrate in which a circuit is formed on only one surface thereof, or an insulating substrate in which a circuit is formed on both surfaces thereof, such as those obtained by using a double-sided copper clad laminate. For this circuit-provided insulating substrate, known laminates which are used for usual wiring boards, for example, glass cloth-epoxy resin, paper-phenol resin, paper-epoxy resin, glass cloth.glass paper-epoxy resin, etc., can be used. The circuit may be formed by any known method, and known manufacturing methods of a wiring board, such as a subtractive method in which a copper clad laminate obtained by sticking a copper foil and the foregoing insulating substrate to each other is used, and an unnecessary portion of the copper foil is removed by etching; an additive method in which a circuit is formed by means of electroless plating in a necessary area of the foregoing insulating substrate; and the like, can be adopted.

In addition, this circuit surface may be subjected to a circuit surface treatment for enhancing the adhesiveness. This treatment method is not particularly limited, and known methods, for example, a method in which a needle crystal of copper oxide is formed with an alkali aqueous solution of sodium hypochlorite on the circuit surface, and the formed needle crystal of copper oxide is dipped in and reduced with a dimethylamine borane aqueous solution, etc., can be adopted.

(Formation of Insulating Resin Layer on Circuit of Circuit-Provided Insulating Substrate)

Next, as for a method for forming an insulating resin layer on the circuit of the circuit-provided insulating substrate as described above, the insulating resin layer can be formed using the foregoing insulating resin layer-provided carrier film by a lamination system or a pressing system.

The lamination system is a method in which the insulating resin layer-provided cast film is brought into contact with the circuit of the circuit-provided insulating substrate in such a manner that the insulating resin layer thereof faces it, the insulating resin layer is laminated using, for example, a vacuum pressure laminator lamination apparatus, and the carrier film is then peeled off.

In the case of using a vacuum pressure laminator lamination apparatus, it is preferable that a temperature is from about 50 to 170° C., and a pressure is 0.2 MPa or more. Similar to the heating temperature, while a preferred pressure value varies with a thickness of the substrate, a residual copper ratio, and the like, there is a concern that if the pressure is too high, the substrate is deformed. Therefore, the pressure is preferably not more than 1.0 MPa. In addition, when a degree of vacuum is not more than 15 hPa, embedding properties into the inner layer circuit board become favorable. It is preferable that the degree of vacuum is low as far as possible. However, taking into consideration an influence that the capacity of the apparatus, a waiting time until reaching a prescribed value, or the like exerts on the productivity, and the like, it is preferable to perform the treatment at a degree of vacuum in the range of from 5 to 10 hPa. A time of heat-press bonding is preferably from about 10 to 90 seconds. When the time of heat-press bonding is 10 seconds or longer, the time required for flowing of the resin into the inner layer circuit is sufficient, whereas when it is not longer than 90 seconds, the productivity is favorable. The time of heat-press bonding is more preferably from 20 to 60 seconds.

On the other hand, in the case of a pressing system, similar to the foregoing, the insulating resin layer-provided cast film is brought into contact with the circuit of the circuit-provided insulating substrate in such a manner that the insulating resin layer thereof faces it, and it is desirable to perform the treatment under an adequate condition in conformity with the insulating resin layer to be used. For example, the insulating resin layer can be formed on the circuit of the circuit-provided insulating substrate by adopting a method of elevating the temperature at a temperature elevating rate of about 3° C./min from about 35° C. to 190° C. while spending about 50 minutes, keeping that temperature under a pressure of from about 2.0 to 3.0 MPa for from about 60 to 90 minutes, and then cooling to room temperature while spending about 30 minutes.

(Thermal Curing Treatment of Insulating Resin Layer)

In the wiring board of the first invention, the insulating resin layer formed on the circuit of the circuit-provided insulating substrate as described above is first subjected to a thermal curing treatment.

It is desirable to perform this thermal curing treatment at a temperature for a time taking into consideration a plating treatment, an annealing treatment of the wiring conductor, and the like to be performed later. This is because when the curing is made to excessively proceed, there is a concern that the adhesiveness to the wiring conductor is lowered at the time of the plating treatment to be performed later, whereas when the curing is insufficient, there is a concern that the insulating resin layer is corroded with an alkali treatment liquid at the time of the plating treatment and dissolved in the plating liquid. Taking into consideration these matters, for example, it is preferable to cure the insulating resin layer by subjecting it to a heat treatment at from 150 to 190° C. for about 30 to 90 minutes.

(Ultraviolet Ray Irradiation Treatment)

In the wiring board of the first invention, the insulating resin layer which has been subjected to a thermal curing treatment as described above is subjected to an ultraviolet ray irradiation treatment. The purpose of this ultraviolet ray irradiation treatment is one explained above regarding the resin composition.

As for a condition of the ultraviolet ray irradiation treatment, it is preferable to use an ultraviolet ray lamp having a maximum wavelength in the range of from 300 to 450 nm and to irradiate ultraviolet rays in an amount of light in the range of from about 1,000 to 5,000 $mJ/cm^2$ under an atmospheric pressure atmosphere. A method for irradiating the insulating resin layer with ultraviolet rays under an atmospheric pressure atmosphere varies with an ultraviolet ray apparatus, and hence, it is not particularly limited. However, taking into consideration the productivity, a conveyor type ultraviolet ray irradiation system is preferable. As the ultraviolet ray lamp, a mercury short arc lamp, a high pressure mercury vapor lamp, a capillary ultra-high pressure lamp, a high pressure lamp, a metal halide lamp, and the like can be used as an ultraviolet ray lamp having a maximum wavelength in the range of from 300 to 450 nm. Of these lamps, a metal halide lamp with a wide wavelength of ultraviolet rays in the whole area is preferable.

The reason why the ultraviolet ray lamp having a maximum wavelength of ultraviolet rays in the range of from 300 to 450 nm is used resides in general-purpose properties and a wavelength region of ultraviolet rays. That is, this is because the ultraviolet ray lamp exhibiting a maximum wavelength of from 300 to 450 nm is generally used as a conveyor type ultraviolet ray irradiation apparatus, for example, a post-exposure apparatus of solder resist. Furthermore, this is because a metal halide type conveyor irradiation apparatus has a wide ultraviolet ray wavelength region, and by using such an apparatus as a substitution, the effects of the first invention can be exhibited without requiring a special apparatus. When the amount of light of the ultraviolet rays is 1,000 $mJ/cm^2$ or more, even if the insulating resin layer is not treated with an oxidizing roughening liquid, the adhesive force to the plated conductor is sufficient, whereas when it is not more than 5,000 $mJ/cm^2$, the adhesive force is favorably revealed, and such is economically advantageous. The amount of light is more preferably in the range of from 2,000 to 4,000 $mJ/cm^2$.

In this way, by subjecting the insulating resin layer after the thermal curing treatment to an ultraviolet ray irradiation treatment, even in a state where the irregular shape of the surface of the insulating resin layer is small, a high adhesive force to the wiring conductor can be revealed.

(Treatment with Oxidizing Roughening Liquid)

In the case where the removal of a smear on the bottom of a via hole is needed, a removal treatment with an oxidizing roughening liquid can be performed. As this oxidizing roughening liquid, a chromium/sulfuric acid roughening liquid, an alkali permanganic acid roughening liquid, a sodium fluoride/chromium/sulfuric acid roughening liquid, a fluoroboric acid roughening liquid, and the like can be used. In addition, at the time of treating with this oxidizing roughening liquid, after dipping in a solvent or an alkaline liquid, or a mixed liquid thereof (in general, a swelling liquid or a primitive liquid), the treatment with an oxidizing roughening liquid may be performed. As the solvent, alcohol based solvents, for example, diethylene glycol monomethyl ether, diethylene glycol monobutyl ether, isopropyl alcohol, etc., can be used. In addition, the alkaline liquid is not particularly limited so far as it is a liquid exhibiting alkalinity at the time of dissolving in water, and a sodium hydroxide solution, a potassium hydroxide solution, and the like can be used. Furthermore, the solvent or the alkaline liquid may be mixed, and for example, a mixture having a composition of 3 g/L of sodium hydroxide and 300 mL/L of diethylene glycol monobutyl ether can be used.

(Plating Treatment)

In the wiring board of the first invention, the surface of the insulating resin layer which has been treated as described above is subjected to a plating treatment as follows.

First of all, the foregoing insulating resin layer is dipped in a hydrochloric acid aqueous solution of stannous chloride to achieve a neutralization treatment and further subjected to a plating catalyst imparting treatment for attaching palladium. The plating catalyst imparting treatment is performed by dipping the foregoing insulating resin layer in a palladium chloride based plating catalyst liquid. Subsequently, this insulating resin layer is dipped in an electroless plating liquid to deposit an electroless plated layer having a thickness of from about 0.3 to 1.5 μm on the plating catalyst attached onto the insulating resin layer. If desired, electroplating can be further performed. As the electroless plating liquid which is used for the electroless plating treatment, a known electroless plating liquid can be used without particular limitations. In addition, as for the electroplating treatment, a known method can be adopted without particular limitations.

A multi-layered wiring board can also be fabricated by repeating such a technique.

[Manufacturing Method of Wiring Board]

The first invention also provides a manufacturing method of a wiring board.

The manufacturing method of a wiring board of the first invention comprises including (a) a step of forming an uncured resin layer (insulating resin layer) on a substrate having a circuit of a wiring conductor by using the resin composition of the first invention, (b) a step of thermally curing the uncured resin layer and subsequently irradiating with ultraviolet rays to form a cured resin layer, and (c) a step of subjecting the cured resin layer to an electroless plating treatment.

In the manufacturing method of a wiring board of the first invention, (d) a step of applying an electroplating treatment onto the electroless plating can be further included, and (c') a step of subjecting the surface of the cured resin layer to a roughening treatment with an oxidizing roughening liquid can be included between the step (b) and the step (c).

Each of the foregoing steps is the same as that shown in the explanation of the wiring board of the first invention as described above.

[2] Second Invention

The manufacturing method of a wiring board according to the second invention is a method for manufacturing a wiring board having an insulating resin layer and a wiring formed on the surface of the insulating resin layer, which includes a laminate forming step of forming a laminate having the insulating resin layer and a support; a hole forming step of providing a hole in the laminate; a desmearing treatment step of removing a smear within the hole with a desmearing treatment liquid; a support removal step of removing the support from the laminate; a wiring forming step of forming the wiring on the surface of the insulating resin layer from which the support has been removed; and after the laminate forming step and before the wiring forming step, an ultraviolet ray irradiation step of irradiating ultraviolet rays on the surface of the insulating resin layer from which the support has been removed, to enhance an adhesive force to the wiring.

The second invention is hereunder described in detail.

[2-1] Embodiment a of the Second Invention

[Laminate Forming Step]

In the present step, a support-provided insulating resin layer composed of a laminate having an insulating resin layer and a support is formed.

<Support>

A material of this support is not particularly limited so far as it is sparingly soluble in a desmearing treatment liquid which is used in a desmearing treatment step as described later, and a synthetic resin, a metal, and the like are useful. As the synthetic resin, polyester films with heat resistance, such as polyethylene terephthalate (PET), polyethylene naphthalate (PEN), etc., are preferable. As the metal, copper is preferable.

A thickness of this support is not particularly limited so far as it is a thickness such that the occurrence of exposure of a part of the surface of the insulating resin layer to be caused due to dissolution in a process of the desmearing treatment step is prevented. The thickness of the support is preferably from about 10 to 200 μm, and more preferably from 20 to 100 μm. In the case where this support is copper, from the viewpoint of making the irregularities of the surface of the insulating resin layer small, a low profile foil is more preferable than a general copper foil, and a profile-free foil is more preferable.

A surface roughness Ra of this support is preferably not more than 0.12 μm, and more preferably not more than 0.1 μm. According to this, the irregularities of the surface of the insulating resin layer coming into contact with the surface of this support can be suppressed, and it is possible to contrive to make the wiring of the surface of the insulating resin layer fine.

<Insulating Resin Layer>

«Insulating Resin Composition»

An insulating resin composition serving as a material of this insulating resin layer is not particularly limited so far as its adhesive force to the wiring is enhanced due to the irradiation with ultraviolet rays, and a thermosetting resin is suitably used.

Preferably, a composition containing (A) an epoxy resin, (B) an active ester group-containing compound, and (C) an epoxy resin curing accelerator is used as the insulating resin composition serving as a material of the insulating resin layer. Furthermore, if desired, an inorganic filler or various additive components can be contained within the range where the object of the second invention is not impaired. As this insulating resin composition, the resin composition in the first invention as described above can be suitably used.

(.(A) Epoxy Resin)

As the epoxy resin as the component (A), an epoxy resin the same as that in the first invention is suitable. Incidentally, from the viewpoints that at the time of treating the insulating resin with a sodium permanganate based roughening liquid for the purpose of removing a smear within a hole such as a via hole, etc., the smear can be easily removed and that a minute roughened irregular shape can be uniformly formed on the surface of the insulating resin, a material in which a hydrocarbon is contained in a skeleton of the epoxy resin is preferable. A material in which a large amount of a cresol novolak type epoxy resin, a phenol novolak type epoxy resin, a bisphenol A type epoxy resin, a bisphenol F type epoxy resin, or an epoxy resin having an ethylenically unsaturated compound in a skeleton thereof is contained in an insulating resin blend is suitable. Furthermore, from the viewpoint of insulation reliability or heat resistance, one or more kinds of the foregoing epoxy resins may be properly mixed.

((B) Active Ester Group-Containing Compound)

As the active ester group-containing compound, any compound can be used without particular limitations so far as it is a compound containing one or more ester groups in one molecule thereof, not containing a hydroxyl group, and being capable of curing an epoxy resin. For example, an ultraviolet ray active ester group-containing compound the same as that in the first invention is suitable.

As for a content of the active ester group-containing compound which is used as a curing agent of the epoxy resin, it is preferable to use the active ester group-containing compound in an amount of from 0.75 to 1.25 equivalents relative to one epoxy equivalent of the epoxy resin. When the content falls within this range, the heat resistance is favorable.

((C) Epoxy Resin Curing Accelerator)

As the epoxy resin curing accelerator, a general curing accelerator which is used for curing of an epoxy resin can be used. For example, an epoxy resin curing accelerator the same as that in the first invention is suitable. In addition, a content of the curing accelerator in the insulating resin is also the same as that described regarding the epoxy resin curing accelerator in the first invention.

(Inorganic Filler)

In the foregoing insulating resin composition, an inorganic filler may be blended for the purpose of increasing the coefficient of thermal expansion or the coating film strength.

The kind and content of the inorganic filler are the same as those described regarding the inorganic filler in the first invention.
(Coupling Agent (Surface Treatment Agent))

For the purpose of increasing the dispersibility of the inorganic filler, the foregoing insulating resin composition may be blended with a coupling agent which is used for the surface treatment of the inorganic filler. As the coupling agent, a coupling agent the same as that in the first invention is suitable.
(Various Additive Components)

As various additive components, for example, a leveling agent, an antioxidant, a flame retardant, a thixotropy-imparting agent, a thickener, and the like can be contained.
(Solvent)

The insulating resin composition is used upon being diluted with a solvent. As this solvent, a solvent the same as that in the first invention is suitable.

Incidentally, as the insulating resin composition, the materials described in Patent Documents 1 to 2 may also be used. For example, a polyphenylene ether resin disclosed in Patent Document 1 may be adopted. An epoxy resin, a phenol resin, a polyimide resin, a polyamide-imide resin, a bismaleimide resin, an unsaturated polyester resin, a silicon resin, and the like exemplified in Patent Document 2 may be adopted.

In addition, the insulating resin composition may be an epoxy resin composition containing an epoxy resin having two or more epoxy groups in one molecule thereof, di(α-naphthyl) isophthalate, and a curing accelerator. A cyclic olefin based resin and a compound having an active ester group may also be used.

«Thickness of Insulating Resin Layer»

A thickness (thickness after drying) of the insulating resin layer is not particularly limited, and it is preferably in the range of from 3 to 60 μm depending upon an application. To make the film thickness of the insulating resin layer thick is advantageous in view of insulation properties. On the other hand, however, from the viewpoint of economy, in general, the thickness of the insulating resin layer is preferably not more than about 60 μm, and for the purpose of ensuring the insulation, it is preferably 3 μm or more.

[Hole Forming Step]

In the present step, after the foregoing laminate forming step, the laminate (the support and the insulating resin layer) is provided with a hole (a via hole, a through-hole, or a part insertion hole).

The formation of this hole is preferably performed by using a drill, a laser, a plasma, or a combined method thereof. As the laser, a carbonic acid gas laser, a YAG laser, and the like are generally used.

[Desmearing Treatment Step]

Subsequently, a smear generated within the hole by the foregoing hole forming step is removed with a desmearing treatment liquid.

On that occasion, since the surface of the insulating resin layer is protected by the support, the occurrence of roughening of the surface of the insulating resin layer with the desmearing treatment liquid (the generation of irregularities) is prevented. According to this, a wiring can be formed later on the surface of insulating resin layer with small irregularities, and fining of the wiring can be achieved.

As this desmearing treatment liquid, an oxidizing roughening liquid the same as that in the first invention is suitable. Subsequently, the laminate is dipped in a hydrochloric acid aqueous solution of stannous chloride to achieve a neutralization treatment, and after washing with water, the resulting laminate is dried for the purpose of moisture removal.

[Support Removal Step]

After the foregoing desmearing treatment, the support is removed from the laminate.

This removal of the support can be performed by means of peeling off, etching, or the like. In the case where the support is a synthetic resin, the removal by means of peeling off is preferable, whereas in the case where the support is a metal, the removal by means of etching is preferable. In the case of etching copper as the support, as an etchant, a sulfuric acid/hydrogen peroxide based aqueous solution, a cupric chloride aqueous solution, a ferric chloride aqueous solution, an ammonium peroxodisulfate aqueous solution, a sodium peroxodisulfate aqueous solution, and the like can be used.

[Ultraviolet Ray Irradiation Step]

By irradiating ultraviolet rays on the surface of the insulating resin layer from which the support has been removed, the adhesive force of the surface of the insulating resin layer to the wiring is enhanced.

In the second invention, since the adhesive force of the surface of the insulating resin layer is enhanced by the irradiation with ultraviolet rays in this way, even when the formation of irregularities is prevented by protecting the surface of the insulating resin layer by the support at the time of the desmearing treatment, the wiring can be formed with a strong adhesive force on the surface of the insulating resin layer in the subsequent wiring forming step.

This method for irradiating ultraviolet rays is not particularly limited, and the ultraviolet rays may be irradiated in the atmosphere, or may be irradiated in an ozone solution as in Patent Document 2.

Incidentally, in the present embodiment, though this ultraviolet ray irradiation step is performed after the foregoing support removal step, the ultraviolet ray irradiation step may also be performed at any timing after the foregoing laminate forming step and before a wiring forming step as described later.

[Wiring Forming Step]

The foregoing wiring is formed on the surface of the foregoing insulating resin layer from which the support has been removed. Since the wiring is formed on the surface of the insulating resin layer whose adhesive force to the wiring has been enhanced by the irradiation with ultraviolet rays as described above, an adhesion of the wiring to the insulating resin layer increases.

For example, it is sufficient that after giving a catalyst to the surface of the insulating resin layer, a prescribed resist pattern is formed on the surface of the insulating layer, and a conductive layer is formed by means of electroless plating, followed by removing the resist pattern. In addition, an electroplating treatment may be further applied onto the electroless plating.

[2-2] Modification Example 1 of Embodiment a of the Second Invention

In the foregoing Embodiment A of the second invention, the ultraviolet ray irradiation step is carried out after the support removal step and before the wiring forming step, but it should not be construed that the second invention is limited thereto.

For example, the ultraviolet ray irradiation step may be carried out after the hole forming step and before the desmearing treatment step. In that case, after the hole forming step, ultraviolet rays are irradiated on the insulating resin layer from the support side of the laminate. The ultraviolet rays transmit through the support to reach the surface of the insulating resin layer, thereby enhancing an adhesive force of this surface of the insulating resin layer to the wiring.

Incidentally, a material of the support which is used in this Modification Example 1 is not particularly limited so far as it is sparingly soluble in the desmearing treatment liquid which is used in the desmearing treatment step and is able to transmit ultraviolet rays therethrough, and a synthetic resin is useful. As the synthetic resin, polyester films with heat resistance, such as polyethylene terephthalate (PET), polyethylene naphthalate (PEN), etc., are preferable.

Since the adhesive force of the surface of the insulating resin layer is enhanced by the irradiation with ultraviolet rays in this way, even when the formation of irregularities is prevented by protecting the surface of the insulating resin layer by the support at the time of the desmearing treatment, the wiring can be formed with a strong adhesive force on the surface of the insulating resin layer in the subsequent wiring forming step.

This method for irradiating ultraviolet rays is not particularly limited, and the ultraviolet rays may be irradiated in the atmosphere.

In this way, by performing the ultraviolet ray irradiation step before the desmearing treatment step, ultraviolet rays can be irradiated on the surface of a smooth support plate before the desmearing treatment, and ultraviolet rays can be uniformly irradiated on the surface of the insulating resin layer.

[2-3] Modification Example 2 of Embodiment a of the Second Invention

In addition, the ultraviolet ray irradiation step may also be carried out after the desmearing step and before the support removal step. In that case, after the desmearing step, ultraviolet rays are irradiated on the insulating resin layer from the support side of the laminate. The ultraviolet rays transmit through the support to reach the surface of the insulating resin layer, thereby enhancing an adhesive force of this surface of the insulating resin layer to the wiring.

Incidentally, a material of the support which is used in this Modification Example 2 is not particularly limited so far as it is sparingly soluble in the desmearing treatment liquid which is used in the desmearing treatment step and is able to transmit ultraviolet rays therethrough, and a synthetic resin is useful. As the synthetic resin, polyester films with heat resistance, such as polyethylene terephthalate (PET), polyethylene naphthalate (PEN), etc., are preferable.

Since the adhesive force of the surface of the insulating resin layer is enhanced by the irradiation with ultraviolet rays in this way, even when the formation of irregularities is prevented by protecting the surface of the insulating resin layer by the support at the time of the desmearing treatment, the wiring can be formed with a strong adhesive force on the surface of the insulating resin layer in the subsequent wiring forming step.

This method for irradiating ultraviolet rays is not particularly limited, and the ultraviolet rays may be irradiated in the atmosphere.

[2-4] Embodiment B of the Second Invention

The manufacturing method of a wiring board according to Embodiment B of the second invention is hereunder described by reference to the accompanying drawings. FIG. 1 is a cross-sectional view explaining a manufacturing method of a wiring board according to Embodiment B of the second invention.

For the sake of convenience, a configuration of a wiring board manufactured by a manufacturing method of a wiring board is first described, and a manufacturing method of this wiring board is then described.

<Wiring Board>

As shown in FIG. 1(f), this wiring board 10 is composed of a substrate 2 having a first wiring circuit 1 on the back surface side and a second wiring circuit 3 on the front surface side, an insulating resin layer 4 on the second wiring circuit 3, a third wiring circuit 5 on this insulating resin layer 4, a first via hole 6 extending from the third wiring circuit 5 to the second wiring circuit 3, and a second via hole 7 extending from the third wiring circuit 5 to the first wiring circuit 1.

(Substrate Having First and Second Wiring Circuits)

The substrate 2 having the first and second wiring circuits 1 and 3 (hereinafter also referred to as "circuit-provided insulating substrate") is not particularly limited so far as it is an insulating substrate having a circuit provided on the both surfaces of the substrate 2, and examples thereof include a double-sided copper clad laminate. For this insulating substrate, known laminates which are used for usual wiring boards, for example, glass cloth-epoxy resin, paper-phenol resin, paper-epoxy resin, glass cloth glass paper-epoxy resin, etc., can be used without particular limitations. The circuit may be formed by any known method, and known manufacturing methods of a wiring board, such as a subtractive method in which a copper clad laminate obtained by sticking a copper foil and the foregoing insulating substrate to each other is used, and an unnecessary portion of the copper foil is removed by etching; an additive method in which a circuit is formed by means of electroless plating in a necessary area of the foregoing insulating substrate; and the like, can be adopted.

In addition, the surface of each of the circuits 1 and 3 may be subjected to a circuit surface treatment for enhancing the adhesiveness. This treatment method is not particularly limited, and known methods, for example, a method in which a needle crystal of copper oxide is formed with an alkali aqueous solution of sodium hypochlorite on the circuit surface, and the formed needle crystal of copper oxide is dipped in and reduced with a dimethylamine borane aqueous solution, etc., can be adopted.

(Insulating Resin Layer)

In the present example, a resin composition containing (A) an epoxy resin, (B) an active ester group-containing compound, and (C) an epoxy resin curing accelerator as described above is used as the insulating resin composition constituting the insulating resin layer.

<Manufacturing Method of Wiring Board>

Next, a manufacturing method of a wiring board having such a structure is described.

(1) Preparation of Insulating Resin Composition:

A preparation method of a thermosetting insulating resin composition is not particularly limited, and a conventionally known preparation method can be adopted.

For example, the thermosetting insulating resin composition can be prepared as a varnish by not only adding the epoxy resin as the component (A), the active ester group-containing compound as the component (B), and the epoxy resin curing accelerator as the component (C) in the foregoing but adding an inorganic filler or various additive components to be used as the need arises, and then mixing and stirring the contents using a mixing machine of every kind inclusive of an ultrasonic dispersion system, an autorotation revolution dispersion system, and the like.

From the viewpoints of coating properties and the like, a solids content concentration of this varnish exclusive of the solvent is preferably from 20 to 70% by mass.

(2) Formation of Support-Provided Insulating Resin Layer (FIG. 1(a)):

The thus prepared insulating resin varnish is coated on a support 9 made of a synthetic resin or a copper foil and then dried to obtain the insulating resin layer 4. The drying after coating the insulating resin varnish on the support 9 can be performed at from 80 to 180° C. for from about 1 to 10 minutes. When the drying temperature is higher than 80° C., or the time is one minute or longer, the drying sufficiently proceeds, and an amount of the residual solvent within the insulating resin layer 4 becomes small. As a result, an amount of the resin flow is suppressed, and the generation of a void within the insulating resin layer 4 to be caused due to volatilization of the residual solvent can be prevented. On the other hand, when the drying temperature is not higher than 180° C., or the time is not longer than 10 minutes, excessive progress of drying can be prevented, and an amount of the resin flow which is considered to be caused due to the progress of the reaction on the surface of the insulating resin layer 4 is lowered.

A thickness (thickness after drying) of the insulating resin layer 4 is not particularly limited, and it is preferably in the range of from 3 to 60 µm depending upon an application. To make the film thickness of the insulating resin layer 4 thick is advantageous in view of insulation properties. On the other hand, however, from the viewpoint of economy, in general, the thickness of the insulating resin layer 4 is preferably not more than about 60 µm, and for the purpose of ensuring the insulation, it is preferably 3 µm or more.

Though a thickness of the support 9 is not particularly limited, it is preferably from about 10 to 200 µm, and more preferably from 20 to 100 µm. In addition, as the support 9, a polyethylene terephthalate (PET) film or a copper foil is suitably used.

(3) Lamination of Support-Provided Insulating Resin Layer and Circuit-Provided Insulating Substrate (FIG. 1(b)):

Lamination of the insulating resin layer 4 provided with the support 9 and the insulating substrate 2 provided with the circuits 1 and 3 can be performed by a lamination process or a pressing process.

In the case of a lamination process, the insulating resin layer 4 provided with the support 9 is superimposed on the wiring circuit 3 of the insulating substrate 2 provided with the circuits 1 and 3 in such a manner that the insulating resin layer 4 faces it, and the insulating resin layer 4 is laminated using, for example, a vacuum pressure laminator.

In the case of using a vacuum pressure laminator, it is preferable that a temperature is from 50 to 170° C., and a pressure is 0.2 MPa or more. Similar to the heating temperature, while a preferred pressure value varies with a thickness of the substrate, a residual copper ratio, and the like, in order to suppress the deformation of the substrate, the pressure is preferably not more than 1.0 MPa·s. In addition, when a degree of vacuum is not more than 15 hPa, embedding properties into the inner layer circuit board are enhanced. On the other hand, it is preferable that the degree of vacuum is high as far as possible. However, taking into consideration an influence that the capacity of the apparatus, a waiting time until reaching a prescribed value, or the like exerts on the productivity, and the like, it is preferable to perform the treatment at a degree of vacuum in the range of from 5 to 10 hPa. When a time of heat-press bonding is 10 seconds or longer, the time required for flowing of the resin into the inner layer circuit is sufficient, whereas when it is not longer than 90 seconds, the productivity is enhanced, and therefore, the time of heat-press bonding is preferably from 20 to 60 seconds.

On the other hand, in the case of a pressing process, similar to the foregoing, the insulating resin layer 4 provided with the support 9 is superimposed on the circuit 3 of the insulating substrate 2 provided with the circuits 1 and 3 in such a manner that the insulating resin layer 4 faces it, and it is desirable to perform the pressing under an adequate condition in conformity with the insulating resin layer 4 to be used. For example, the insulating resin 4 provided with the support 9 can be formed on the circuit 3 of the insulating substrate 4 provided with the circuits 1 and 3 by elevating the temperature at a temperature elevating rate of 3° C./min for 50 minutes, keeping at 190° C. under a pressure of from 2.0 to 3.0 MPa for from 60 to 90 minutes, and then cooling to room temperature for 30 minutes.

(4) Thermal Curing of Insulating Resin Layer (FIG. 1(c)):

The insulating resin layer 4 formed on the circuit 3 of the insulating substrate 2 provided with the circuits 1 and 3 as described above is first thermally cured. It is desirable to perform this thermal curing at a temperature for a time taking into consideration a plating treatment, an annealing treatment of the wiring conductor, and the like to be performed later. This is because when the curing is made to excessively proceed, there is a concern that the adhesiveness to the wiring conductor is lowered at the time of the subsequent plating treatment, whereas when the curing is reversely insufficient, there is a concern that the insulating resin layer 4 is corroded with an alkali treatment liquid at the time of the plating treatment and dissolved in the plating liquid. Taking into consideration these matters, for example, in the case of the epoxy resin based insulating resin 4, it is preferable to cure the insulating resin layer 4 by applying a heat treatment at from 150 to 190° C. for about 30 to 90 minutes.

(5) Boring Processing and Desmearing Treatment (FIG. 1(d)):

Subsequently, boring processing is performed to form the via hole 6 and the through-hole 7. Details of this boring processing are those described above.

Subsequently, desmearing within the via hole 6 and the through-hole 7 is performed with a desmearing treatment liquid. Details of this desmearing treatment liquid are those described above for the hole forming step.

(6) Removal of Support (FIG. 1(e)):

Subsequently, the synthetic resin film or the copper foil as the support 9 is removed. The synthetic resin film is preferably removed by peeling off. On the other hand, the copper foil is preferably removed by means of etching.

(7) Ultraviolet Ray Irradiation (FIG. 1(e))

Subsequently, ultraviolet rays are irradiated on the surface of the insulating resin layer 4 which has been exposed by the removal of the support 9. According to this, nevertheless the irregular shape of the surface of the insulating resin layer 4 is small, a high adhesive force to the wiring conductor is revealed.

Though its mechanism is not always elucidated yet, it may be conjectured that by irradiating the insulating resin layer 4 with ultraviolet rays, an oxygen-containing group is formed due to decomposition of the active ester group in the active ester group-containing compound as the component (B) on the surface of the insulating resin layer 4, and this oxygen-containing group brings about a high adhesive force to the wiring conductor. An amount of the oxygen atom of the oxygen-containing group formed on the surface of the insulating resin 4 can be measured by the X-ray photoelectron spectroscopy.

As for a condition of the foregoing ultraviolet ray irradiation, for example, it is desirable to use an ultraviolet ray lamp capable of undergoing radiation in the range of from 300 to 450 nm and to irradiate ultraviolet rays in an amount of light of from about 1,000 to 5,000 mJ/cm$^2$, and preferably from 2,000 to 4,000 mJ/cm$^2$ under an atmospheric pressure atmosphere. Incidentally, the foregoing amount of light (mJ/cm$^2$) is expressed by "illuminance (mW/cm$^2$)×irradiation time (sec)".

In this way, by subjecting the insulating resin layer 4 to a thermal curing treatment and subsequently an ultraviolet ray irradiation treatment, even if an irregular shape by using a conventionally used a sodium permanganate based roughening liquid or other roughening liquid is not formed, a high adhesive force to the wiring conductor may be revealed.

Incidentally, a temperature of the insulating resin layer 4 at the time of ultraviolet ray irradiation is preferably from about 50 to 90° C., and more preferably from 60 to 80° C.

A method for irradiating the insulating resin 4 with ultraviolet rays under an atmospheric pressure atmosphere varies with an ultraviolet ray apparatus, and hence, it is not particularly limited. However, taking into consideration the productivity, conveyor type ultraviolet ray irradiation is preferable. As the ultraviolet ray lamp, a mercury short arc lamp, a high pressure mercury vapor lamp, a capillary ultra-high pressure lamp, a high pressure lamp, a metal halide lamp, and the like can be used as an ultraviolet ray lamp having a wavelength in the range of from 300 to 450 nm. Of these lamps, a metal halide lamp with a wide wavelength of ultraviolet rays in the whole area is preferable.

An object of the use of the ultraviolet ray lamp having a wavelength of ultraviolet rays in the range of from 300 to 450 nm is related to general-purpose properties and a wavelength region of ultraviolet rays. That is, this is because the ultraviolet ray lamp having a wavelength of from 300 to 450 nm is generally used as a conveyor type ultraviolet ray irradiation apparatus, for example, a post-exposure apparatus of solder resist.

Furthermore, a metal halide type conveyor irradiation apparatus has a wide ultraviolet ray wavelength region, and by using such an apparatus as a substitution, the effects of the second invention can be exhibited without requiring a special apparatus. When an amount of the ultraviolet rays is 1,000 mJ/cm$^2$ or more, in the case where the insulating resin layer 4 is not treated with an oxidizing roughening liquid, the adhesive force to the plated conductor is sufficient, whereas even when it exceeds 5,000 mJ/cm$^2$, the adhesive force does not change, and therefore, it is preferably from 1,000 to 5,000 mJ/cm$^2$. The amount of the ultraviolet rays is more preferably in the range of from 2,000 mJ/cm$^2$ to 4,000 mJ/cm$^2$.

(8) Plating Treatment (FIG. 1(*f*)):

In the present embodiment, the surface of the insulating resin layer 4 which has been treated with ultraviolet rays is subjected to a plating treatment as follows.

First of all, the foregoing insulating resin layer 4 is subjected to a plating catalyst imparting treatment for attaching palladium. The plating catalyst treatment is performed by dipping in a palladium chloride based plating catalyst liquid. Subsequently, the insulating resin layer 4 is dipped in an electroless plating liquid to deposit an electroless plated layer having a thickness of from 0.3 to 1.5 μm thereon. If desired, electroplating is further performed. As the electroless plating liquid which is used for the electroless plating, a known electroless plating liquid can be used without particular limitations. In addition, as for the electroplating, a known method can be adopted without particular limitations.

In this way, the wiring board 10 can be manufactured by forming the wiring circuit 5 on the insulating resin layer 4 by the plating treatment.

In the present example, while the double-sided wiring substrate is used, a single-sided wiring board may be used. In addition, while every one layer of the insulating resin layer and the wiring circuit is formed on the surface of the double-sided wiring substrate, a multi-layered wiring board can also be fabricated by repeating such a technique to form plural layers of each of the insulating resin layer and the wiring circuit.

[2-5] Modification Example of Embodiment B of the Second Invention

In the foregoing Embodiment B of the second invention, the ultraviolet ray irradiation is carried out after the support removal and before the plating treatment, but it should not be construed that the second invention is limited thereto.

For example, the ultraviolet ray irradiation may be carried out after the boring processing and before the desmearing treatment. In that case, after the boring processing, the insulating resin layer 4 is subjected to an ultraviolet ray irradiation treatment from the side of the support 9 under the following condition in a state where the support 9 is present on the surface of the insulating resin layer 4. According to this, the surface of the insulating resin layer 4 reveals a high adhesive form to the wiring conductor.

In addition, the ultraviolet ray irradiation may also be carried out after the desmearing treatment and before the removal of the support. In that case, after the desmearing treatment, the insulating resin layer 4 is subjected to an ultraviolet ray irradiation treatment from the side of the support 9 under the following condition in a state where the support 9 is present on the surface of the insulating resin layer 4. According to this, the surface of the insulating resin layer 4 reveals a high adhesive form to the wiring conductor.

Incidentally, in the case where the ultraviolet ray irradiation is performed in a state where the support is present as in such Modification Example, the foregoing synthetic resin is useful as the support.

[2-6] Embodiment C of the Second Invention

FIG. 2 is a cross-sectional view explaining another example of a manufacturing method of a wiring board.
<Explanation of Structure of Wiring Board of FIG. 2>
As shown in FIG. 2(*c*), a wiring board 20 has a prepreg laminate 21, insulating resin layers 4 laminated on both the upper and lower sides thereof, third wiring circuits 5 laminated on both the upper and lower sides thereof, and a through-hole 7 penetrating these layers.
<Manufacturing Method of Wiring Board of FIG. 2>
(1)' Fabrication of Prepreg Laminate:
Epoxy resin based prepreg sheets in a semi-cured state, which are reinforced with glass fibers or the like, are superimposed to fabricate the prepreg laminate 21.
(1) Preparation of Insulating Resin Composition:
Similar to the foregoing Embodiment B of the second invention, a thermosetting insulating resin composition is prepared.

(2) Formation of Support-Provided Insulating Resin Layer:

Similar to the foregoing Embodiment B of the second invention, the insulating resin layer 4 provided with the support 9 is formed.

(3) Lamination Between Support-Provided Insulating Resin Layer and Circuit-Provided Insulating Substrate (FIG. 2(*a*)):

The insulating resin layer 4 provided with the support 9 is superimposed on each of the front and back surfaces of the prepreg laminate 21 in such a manner that the side of the insulating resin layer 4 comes into contact therewith, and these are laminated. Similar to the foregoing Embodiment B of the second invention, this lamination method can be performed by a lamination process or a pressing process.

(4) Thermal Curing of Insulating Resin Layer (FIG. 2(*b*)):

Similar to the foregoing Embodiment B of the second invention, thermal curing of the insulating resin layer 4 is performed.

(5) Boring Processing and Desmearing Treatment (FIG. 2(*b*)):

Subsequently, boring processing for penetration in the thickness direction is performed to form the through-hole 7, and then, a desmearing treatment within the through-hole 7 is performed. Details of the boring processing and the desmearing treatment are the same as those in the first example (FIG. 1).

(6) Removal of Support:

Similar to Embodiment B of the second invention, the support 9 is removed.

(7) Ultraviolet Ray Irradiation:

Similar to Embodiment B of the second invention, the insulating resin layers 4 on the both surfaces are subjected to an ultraviolet ray irradiation treatment.

(8) Plating Treatment (FIG. 2(*c*)):

Similar to Embodiment B of the second invention, the insulating resin layers 4 on the both surfaces are subjected to a plating treatment to manufacture the third wiring circuits 5 and 5.

In this way, the wiring board 20 can be manufactured.

In the present example, while every one layer of the insulating resin layer 4 and the wiring circuit 5 is formed on the both surfaces of the prepreg laminate, plural layers of each of the insulating resin layer 4 and the wiring circuit 5 may be formed by repeating such a technique.

[2-7] Modification Example of Embodiment C of the Second Invention

In the foregoing Embodiment C of the second invention, the ultraviolet ray irradiation is carried out after the support removal and before the plating treatment, but it should not be construed that the second invention is limited thereto.

For example, the ultraviolet ray irradiation may be carried out after the boring processing and before the desmearing treatment. In that case, after the boring processing, the insulating resin layers 4 on the both surfaces are subjected to an ultraviolet ray irradiation treatment.

In addition, the ultraviolet ray irradiation may also be carried out after the desmearing treatment and before the removal of the support. In that case, after the desmearing treatment, the insulating resin layers 4 on the both surfaces are subjected to an ultraviolet ray irradiation treatment.

Incidentally, in the case where the ultraviolet ray irradiation is performed in a state where the support is present as in such Modification Example, the foregoing synthetic resin is useful as the support.

EXAMPLES

[1] Next, the first invention is described in more detail by reference to the following Examples, but it should be construed that the first invention is not limited to these Examples at all.

(Evaluation Methods)

The evaluation of each of the Examples and Comparative Examples was performed by the following methods.

(1) Adhesive Strength to Outer Layer Circuit (90-Degree Peeling, Unit: kN/m)

A portion having a width of 10 mm and a length of 100 mm was formed in a part of an outer layer circuit layer (third circuit layer), and one end thereof was peeled off and gripped by a gripper. Then, a load at the time of ripping off a portion of about 50 mm in the vertical direction at room temperature was measured.

(2) Roughness of Insulating Resin Layer of Plated Copper Etching Removed Surface (Average Surface Roughness, Unit: μm):

A test piece in which an outer layer circuit is subjected to an etching treatment to remove copper is fabricated. This test piece was cut into a size of 2 mm square; different three areas in the test piece were measured using an ultra-high depth shape measurement microscope "VK-8500 Model", manufactured by Keyence Corporation under a condition at a measuring length of 149 μm, a magnification of 2,000 times, and a resolution of 0.05 μm; a value obtained by subtracting a minimum part from a maximum part in roughness in the measuring length of 149 μm was defined as a surface roughness of the insulating resin layer; and an average value of the roughness in the three areas was calculated.

(3) Solder Heat Resistance:

A multi-layered wiring board was cut into a size of 25 mm square and immediately thereafter, floated on a solder bath prepared at 288° C.±2° C., and a time until swelling was generated was examined.

Example 1

(1) Fabrication of Circuit Board:

A glass cloth base material epoxy resin double-sided copper clad laminate (a trade name: "MCL-E-67", manufactured by Hitachi Chemical Co., Ltd., having a thickness of a copper foil of 18 μm and a thickness of a substrate of 0.8 mm and having a roughened foil on the both surfaces thereof) was subjected to etching to fabricate a circuit board having a circuit layer (hereinafter referred to as "first circuit layer") on one surface thereof.

(2) Preparation of Epoxy Resin as the Component (A):

In a flask equipped with a thermometer and a stirrer, 228 g (1.00 mole) of bisphenol A and 92 g (0.85 moles) of 1,6-hexanediol divinyl ether were charged, and the temperature was elevated to 120° C. while spending one hour. Thereafter, the contents were further reacted at 120° C. for 6 hours, thereby obtaining 400 g of a transparent semi-solid modified polyhydric phenol.

Subsequently, in a flask equipped with a thermometer, a dropping funnel, a cooling tube, and a stirrer, 400 g of the foregoing modified polyhydric phenol, 925 g (10 moles) of epichlorohydrin, and 185 g of n-butanol were charged and dissolved. Thereafter, the temperature was elevated to 65° C. while purging with a nitrogen gas, the pressure was reduced to a pressure at which azeotropy was generated, and 122 g (1.5 moles) of a 49% sodium hydroxide aqueous solution was added dropwise over 5 hours. Subsequently, stirring was continued for 0.5 hours under this condition. Meanwhile, a distillate having been azeotropically distilled was separated by a Dean-Stark trap, an aqueous layer was removed, and an organic layer was reacted while being returned into the reaction system. Thereafter, the unreacted epichlorohydrin was distilled off by means of distillation under reduced pressure. To the obtained crude epoxy resin, 1,000 g of methyl isobutyl ketone and 100 g of n-butanol were added for dissolution. Furthermore, 20 g of a 10% sodium hydroxide aqueous solution was added to this solution, and the contents were reacted at 80° C. for 2 hours. Thereafter, washing with 300 g of water was repeated three times until a pH of the washing liquid became neutral. Subsequently, the inside of the system was dehydrated by means of azeotropy, and after going through precision filtration, the solvent was distilled off under reduced pressure, thereby obtaining 457 g of an epoxy resin as a transparent liquid. An epoxy equivalent was 403.

(3) Preparation of Resin Composition:

49 parts by mass of the epoxy resin prepared in (2) as the component (A), 14 parts by mass of an ultraviolet ray active ester group-containing resin (a trade name: "EXB-9451", manufactured by DIC Corporation, ester equivalent: 223) as the component (B), and 0.15 parts by mass of 1-cyanoethyl-2-phenylimidazoliumtrimellitate (a trade name: "2PZ-CNS", manufactured by Shikoku Chemicals Corporation) as the component (C) were dissolved in 31 parts by mass of methyl ethyl ketone (hereinafter referred to as "MEK") as a solvent, thereby obtaining a resin composition (varnish).

(4) Formation of Insulating Resin Layer, and Thermal Curing.Ultraviolet Ray Irradiation Treatment:

The resin composition (varnish) obtained above in (3) was coated on a polyethylene terephthalate (PET) film (thickness: 38 μm) as a carrier film and subjected to a drying treatment at 100° C. for 10 minutes, thereby fabricating an insulating resin layer-provided carrier film roll having a film thickness of 50±3 μm.

Furthermore, the foregoing insulating resin layer-provided carrier film was laminated on one surface of the circuit board obtained above in (1) by using a batch type vacuum pressure laminator "MVLP-500" (a trade name, manufactured by Meiki Co., Ltd.) in such a manner that the insulating resin layer came into contact with the circuit layer.

Subsequently, after peeling off the carrier film, the insulating resin layer was subjected to a thermal curing treatment under a curing condition at 170° C. for 60 minutes and then irradiated with ultraviolet rays in an amount of light of 3,000 mJ/cm$^2$ by a metal halide lamp (maximum wavelength: 350 to 380 nm) using a conveyor type ultraviolet ray irradiation apparatus.

(5) Electroless Plating Treatment and Electroplating Treatment:

As a pre-treatment of electroless plating, the insulating resin layer-provided substrate obtained above in (4) was dipped in a conditioner liquid "CLC-601" (a trade name, manufactured by Hitachi Chemical Co., Ltd.) at 60° C. for 5 minutes, and thereafter, the resulting insulating resin layer-provided substrate was washed with water and dipped in a pre-dipping liquid "PD-201" (a trade name, manufactured by Hitachi Chemical Co., Ltd.) at room temperature for 2 minutes. Subsequently, the insulating resin layer-provided substrate was subjected to a dipping treatment with "HS-202B" (a trade name, manufactured by Hitachi Chemical Co., Ltd.) as an electroless plating catalyst containing PdCl$_2$ at room temperature for 10 minutes, and thereafter, the resulting insulating resin layer-provided substrate was washed with water, dipped in a "CUST-201 plating liquid" (a trade name, manufactured by Hitachi Chemical Co., Ltd.) as an electroless copper plating liquid at room temperature for 15 minutes, and further subjected to electroplating with copper sulfate. Thereafter, annealing was performed at 170° C. for 30 minutes to form a conductor layer having a thickness of 20 μm on/the surface of the insulating resin layer.

(6) Formation of Circuit:

For the purpose of performing etching removal of an unnecessary area of the plated conductor layer, an oxide film on the copper surface was removed by means of polishing with a #600 buff roll. Thereafter, a resist film for etching was formed and subjected to an etching treatment, and the resist film for etching was then removed to form a second circuit containing a via hole connected to the first circuit. Furthermore, for the purpose of multi-layering, the surface of the second circuit conductor was dipped in an aqueous solution containing 50 g/L of sodium chlorite, 20 g/L of NaOH, and 10 g/L of trisodium phosphate at 85° C. for 20 minutes and then washed with water, followed by drying at 80° C. for 20 minutes, thereby forming irregularities of copper oxide on the surface of the second circuit conductor.

(7) Fabrication of Multi-Layered Wiring Board:

The foregoing steps (4) to (6) were repeated to fabricate a multi-layered wiring board of three layers. Incidentally, the circuit layer to be formed on the outermost side is called a third circuit layer (or an outer layer circuit layer). Results obtained by evaluation in the above method are shown in Table 1 about the multi-layered wiring board.

Examples 2 to 7

Various multi-layered wiring boards were fabricated by following the same operations as those in Example 1, except that in Example 1, the composition of the resin composition was changed as shown in Table 1. Results obtained by evaluation in the same manners as those in Example 1 are shown in Table 1.

Example 8

A multi-layered wiring board was fabricated by following the same operations as those in Example 1, except that in Example 1, a resin composition in which spherical silica "SO-25R" (a trade name, manufactured by Admatechs Company Limited) having an average particle diameter of 0.5 μm was added as the inorganic filler as shown in Table 1 was used; and that the amount of the solvent was changed to 51 parts by mass. Results obtained by evaluation in the same manners as those in Example 1 are shown in Table 1.

Example 9

The formation of an insulating resin layer and the thermal curing were carried out in the same manners as those described in Example 1 by using the same resin composition as that in Example 1. Subsequently, via holes for interlayer connection were processed and fabricated on this insulating resin layer-provided substrate by using a CO$_2$ laser drilling machine "LCO-1821 Model", manufactured by Hitachi Via Mechanics, Ltd. under a condition at a beam diameter of 80 μm, a frequency of 500 Hz, a pulse width of 5 μsec, and a shot number of 7. Thereafter, the insulating resin layer-provided substrate was irradiated with ultraviolet rays in an amount of light of 3,000 mJ/cm$^2$ by using a conveyor type ultraviolet ray irradiation apparatus with a metal halide lamp as the lamp (maximum wavelength: 350 to 380 nm).

Subsequently, in order to chemically roughen the insulating resin layer, an aqueous solution containing 200 mL/L of diethylene glycol monobutyl ether and 5 g/L of NaOH as a swelling liquid was heated to 80° C., and the insulating resin layer-provided substrate was dipped therein for 5 minutes. Subsequently, an aqueous solution containing 60 g/L of $KMnO_4$ and 40 g/L of NaOH as a roughening liquid was heated to 80° C., and the insulating resin layer-provided substrate was dipped therein for 10 minutes. Subsequently, the resulting insulating resin layer-provided substrate was dipped in an aqueous solution of a neutralizing liquid ($SnCl_2$: 30 g/L, $H_2SO_4$ having a concentration of 98% by mass: 300 mL/L) at room temperature for 5 minutes, thereby achieving neutralization. Thereafter, a multi-layered wiring board was fabricated by following the same operations as those in Example 1. Results obtained by evaluation in the same manners as those in Example 1 are shown in Table 1.

Example 10

A multi-layered wiring board was fabricated by following the same operations as those in Example 1, except that in Example 1, the lamp for ultraviolet ray irradiation was changed to a conveyor type ultraviolet ray irradiation apparatus with a high pressure mercury vapor lamp (maximum wavelength: 310 to 370 nm). Incidentally, similar to Example 1, the ultraviolet rays were irradiated in an amount of light of 3,000 mJ/cm$^2$.

Comparative Example 1

A multi-layered wiring board was fabricated by following the same operations as those in Example 1, except that in Example 1, the composition of the resin composition was changed so as to not use the ultraviolet ray active ester group-containing compound as shown in Table 1. Results obtained by evaluation in the same manners as those in Example 1 are shown in Table 1.

Comparative Example 2

A multi-layered wiring board was fabricated by following the same operations as those in Example 1, except that in the resin composition of Example 1, a phenol novolak type epoxy resin (a trade name: "N-770", manufactured by DIC Corporation, hydroxyl group equivalent: 190) that is an epoxy resin not having a structural unit derived from hexanediol was used as the component (A) as shown in Table 1. Results obtained by evaluation in the same manners as those in Example 1 are shown in Table 1.

Comparative Example 3

A multi-layered wiring board was fabricated by following the same operations as those in Example 1, except that in the resin composition of Example 1, a phenol novolak type epoxy resin (a trade name: "TD-2131", manufactured by DIC Corporation, ester equivalent: 105) was used as the component (B) as shown in Table 1. Results obtained by evaluation in the same manners as those in Example 1 are shown in Table 1.

TABLE 1

| | | Example | | | | | | | |
|---|---|---|---|---|---|---|---|---|---|
| | | 1 | 2 | 3 | 4 | 5 | 6 | 7 | 8 |
| Component (A) | A1 | 49 | 99 | 116 | 80 | 33 | 115 | 121 | 49 |
| Comparative component | A2 | — | — | — | 20 | 57 | — | — | — |
| Component (B) | B1 | 14 | 64 | 51 | 73 | 90 | 38 | 13 | 14 |
| Comparative component | B2 | — | — | — | — | — | 17 | 36 | — |
| | B3 | — | — | — | — | — | — | — | — |
| Component (C) | C1 | 0.15 | 0.3 | 0.35 | 0.3 | 0.27 | 0.35 | 0.36 | 0.15 |
| | C2 | — | — | — | — | — | — | — | — |
| Solvent | D1 | 31 | 47 | 48 | 54 | 59 | 41 | 38 | 51 |
| Inorganic filler | E1 | — | — | — | — | — | — | — | 38 |
| Evaluation results | 90-Degree peeling (kN/m) | 0.8 | 0.7 | 0.7 | 0.8 | 0.8 | 0.8 | 0.7 | 0.7 |
| | Average surface roughness (μm) | 0.05> | 0.05> | 0.05> | 0.05> | 0.05> | 0.05> | 0.05> | 0.05> |
| | Solder heat resistance (sec) | >60 | >60 | >60 | >60 | >60 | >60 | >60 | >60 |

| | | Example | | | Comparative Example | | |
|---|---|---|---|---|---|---|---|
| | | 9 | 10 | 11 | 1 | 2 | 3 |
| Component (A) | A1 | 49 | 49 | 49 | 24 | — | 82 |
| Comparative component | A2 | — | — | — | — | 71 | — |
| Component (B) | B1 | 14 | 14 | 14 | — | 90 | — |
| Comparative component | B2 | — | — | — | — | — | — |
| | B3 | — | — | — | — | — | 18 |
| Component (C) | C1 | 0.15 | 0.15 | — | 0.07 | 0.3 | 0.25 |
| | C2 | — | — | 0.15 | — | — | — |
| Solvent | D1 | 31 | 31 | 31 | 31 | 55 | 60 |
| Inorganic filler | E1 | — | — | — | — | — | — |

TABLE 1-continued

| | | | | | | | |
|---|---|---|---|---|---|---|---|
| Evaluation results | 90-Degree peeling (kN/m) | 0.9 | 0.9 | 0.7 | 0.05 | 0.5 | 0.05 |
| | Average surface roughness (μm) | 0.1> | 0.05> | 0.05> | 0.05> | 0.05> | 0.05> |
| | Solder heat resistance (sec) | >60 | >60 | >60 | <1 | <1 | <1 |

A1: Epoxy resin having hexanediol in a skeleton thereof (prepared in Example 1(2))
A2: Phenol novolak type epoxy resin, "N-770" (a trade name, manufactured by DIC Corporation, as a comparative component)
B1: Ultraviolet ray active ester group-containing compound, "EXB-9451" (a trade name, manufactured by DIC Corporation, ester equivalent: 223)
B2: Cresol novolak type phenol resin, "KA-1165" (a trade name, manufactured by DIC Corporation, as a comparative component)
B3: Phenol novolak type resin, "TD-2131" (a trade name, manufactured by DIC Corporation, as a comparative component)
C1: Curing accelerator, imidazole derivative compound, 1-cyanoethyl-2-phenylimidazolium trimellitate (a trade name: "2PZ-CNS", manufactured by Shikoku Chemicals Corporation)
C2: Curing accelerator, triphenyl phosphine
D1: Methyl ethyl ketone (MEK)
E1: Inorganic filler, spherical silica having an average particle diameter of 0.5 μm, "SO-25R" (a trade name, manufactured by Admatechs Company Limited)

It is noted from Table 1 that as shown in the Examples, the wiring board having an insulating resin layer prepared by thermally curing a resin composition and irradiating it with ultraviolet rays is favorable in the adhesive strength to the outer layer copper in a state where the surface roughness of the insulating resin layer is small, so that it is suitable for realization of fine wiring. In addition, the subject wiring board is excellent in the solder heat resistance at 288° C. and also excellent in lead-free solder mounting.

[2] Next, the second invention is described in more detail by reference to the following Examples, but it should be construed that the second invention is not limited to these Examples at all.

Incidentally, various characteristics of each of the Examples were determined by the following methods.

Characteristics of Multi-Layered Wiring Board:

(i) Adhesive Strength to Circuit:

A portion having a width of 10 mm and a length of 100 mm was formed in a part of an outermost layer circuit layer (a third circuit layer in a multi-layered wiring board and a first circuit layer in a single-layered wiring board, respectively), and one end thereof was peeled off and gripped by a gripper. Then, a load at the time of ripping off a portion of about 50 mm in the vertical direction at room temperature was measured.

(ii) Roughness of Insulating Resin Layer of Plated Copper Etching Removed Surface:

A test piece in which an outer layer circuit is subjected to an etching treatment to remove copper is fabricated. This test piece was cut into a size of 2 mm square; different three areas in the test piece were measured using an ultra-high depth shape measurement microscope "VK-8500 Model", manufactured by Keyence Corporation under a condition at a measuring length of 149 μm, a magnification of 2,000 times, and a resolution of 0.05 μm; a value obtained by subtracting a minimum part from a maximum part in roughness in the measuring length of 149 μm was defined as a surface roughness of the insulating resin layer; and an average value of the roughness in the three areas was calculated.

(iii) Solder Heat Resistance:

A wiring board was cut into a size of 25 mm square and immediately thereafter, floated on a solder bath prepared at 288° C.±2° C., and a time until swelling was generated was examined.

Example 12

(1) Fabrication of Circuit Board:

A glass cloth base material epoxy resin double-sided copper clad laminate (a trade name: "MCL-E-67", manufactured by Hitachi Chemical Co., Ltd., having a thickness of a copper foil of 18 μm and a thickness of a substrate of 0.8 mm and having a roughened foil on the both surfaces thereof) was subjected to etching to fabricate a circuit board having a circuit layer (hereinafter referred to as "first circuit layer"): on one surface thereof.

(2) Preparation of Epoxy Resin A-1 as the Component (A):

In a flask equipped with a thermometer and a stirrer, 228 g (1.00 mole) of bisphenol A and 92 g (0.85 moles) of 1,6-hexanediol divinyl ether were charged, and the temperature was elevated to 120° C. while spending one hour. Thereafter, the contents were further reacted at 120° C. for 6 hours, thereby obtaining 400 g of a transparent semi-solid modified polyhydric phenol.

Subsequently, in a flask equipped with a thermometer, a dropping funnel, a cooling tube, and a stirrer, 400 g of the foregoing modified polyhydric phenol, 925 g (10 moles) of epichlorohydrin, and 185 g of n-butanol were charged and dissolved. Thereafter, the temperature was elevated to 65° C. while purging with a nitrogen gas, the pressure was reduced to a pressure at which azeotropy was generated, and 122 g (1.5 moles) of a 49% sodium hydroxide aqueous solution was added dropwise over 5 hours. Subsequently, stirring was continued for 0.5 hours under this condition. Meanwhile, a distillate having been azeotropically distilled was separated by a Dean-Stark trap, an aqueous layer was removed, and an organic layer was reacted while being returned into the reaction system. Thereafter, the unreacted epichlorohydrin was distilled off by means of distillation under reduced pressure. To the obtained, crude epoxy resin, 1,000 g of methyl isobutyl ketone and 100 g of n-butanol were added for dissolution. Furthermore, 20 g of a 10% sodium hydroxide aqueous solution was added to this solution, and the contents were reacted at 80° C. for 2 hours. Thereafter, washing with 300 g of water was repeated three times until a pH of the washing liquid became neutral. Subsequently, the inside of the system was dehydrated by means of azeotropy, and after going through precision filtration, the solvent was distilled off under reduced pressure, thereby obtaining 457 g of an epoxy resin as a transparent liquid. An epoxy equivalent was 403.

(3) Preparation of Insulating Resin Composition:

A composition of an insulating resin is shown in Table 2. 49 parts by mass of the epoxy resin prepared in (2) as the component (A), 27 parts by mass of an ultraviolet ray active ester group-containing resin (a trade name: "EXB-9460S", manufactured by DIC Corporation, ester equivalent: 223) as the component (B), and 0.15 parts by mass of 1-cyanoethyl-2-phenylimidazolium trimellitate (a trade name: "2PZ-CNS", manufactured by Shikoku Chemicals Corporation) as the component (C) were dissolved in 40 parts by mass of methyl ethyl ketone (hereinafter referred to as "MEK") as a solvent, thereby obtaining an insulating resin composition (varnish).

(4) Formation of Support-Provided Insulating Resin Layer:

The insulating resin composition obtained above in (3) was coated on a polyethylene terephthalate (PET) film (thickness: 38 μm) and subjected to a drying treatment at 100° C. for 10 minutes, thereby fabricating a support-provided insulating resin layer having a film thickness of 50±3 μm.

(5) Lamination.Thermal Curing Treatment:

Furthermore, the foregoing support-provided insulating resin layer and the circuit board obtained above in (1) were superimposed in such a manner that the insulating resin layer and the circuit layer came into contact with each other, followed by lamination by using a batch type vacuum pressure laminator "MVLP-500" (a trade name, manufactured by Meiki Co., Ltd.). Subsequently, the insulating resin layer was subjected to a thermal curing treatment under a curing condition at 170° C. for 60 minutes, thereby obtaining an insulating resin layer-provided substrate.

(6) Formation of Via Hole:

Via holes for interlayer connection extending from the support to the circuit layer were processed and fabricated on this insulating resin layer-provided substrate by using a $CO_2$ laser drilling machine "LCO-1B21 Model", manufactured by Hitachi Via Mechanics, Ltd. under a condition at a beam diameter of 80 μm, a frequency of 500 Hz, a pulse width of 5 μsec, and a shot number of 7.

(7) Desmearing Treatment:

In order to perform a desmearing treatment within the foregoing via holes, an aqueous solution containing 200 mL/L of diethylene glycol monobutyl ether and 5 g/L of NaOH as a swelling liquid was heated to 80° C., and the insulating resin layer-provided substrate was dipped therein for 5 minutes. Subsequently, an aqueous solution containing 60 g/L of $KMnO_4$ and 40 g/L of NaOH as a desmearing treatment liquid was heated to 80° C., and the insulating resin layer-provided substrate was dipped therein for 20 minutes. Subsequently, the resulting insulating resin layer-provided substrate was dipped in an aqueous solution of a neutralizing liquid ($SnCl_2$: 30 g/L, $H_2SO_4$ having a concentration of 98% by mass: 300 mL/L) at room temperature for 5 minutes, thereby achieving neutralization. Thereafter, the insulating resin layer-provided substrate was washed with water for 5 minutes and then dried at 100° C. for 10 minutes.

(8) Support Removal Treatment:

Subsequently, the support (PET film) was peeled off from the insulating resin composition and removed.

(9) Ultraviolet Ray Irradiation:

The foregoing insulating resin-provided substrate was irradiated with ultraviolet rays at 3,000 mJ/cm$^2$ by using a conveyor type ultraviolet ray irradiation apparatus with a metal halide lamp as the lamp (wavelength: 350 to 380 nm).

(10) Formation of Second Circuit Layer:

As a pre-treatment of electroless plating, the surface of the insulating resin layer was dipped in a conditioner liquid "CLC-601" (a trade name, manufactured by Hitachi Chemical Co., Ltd.) at 60° C. for 5 minutes. Thereafter, the resulting insulating resin layer-provided substrate was washed with water and dipped in a pre-dipping liquid "PD-201" (a trade name, manufactured by. Hitachi Chemical Co., Ltd.) at room temperature for 2 minutes. Subsequently, the insulating resin layer-provided substrate was subjected to a dipping treatment with "HS-202B" (a trade name, manufactured by Hitachi Chemical Co., Ltd.) as an electroless plating catalyst containing $PdCl_2$ at room temperature for 10 minutes, and thereafter, the resulting insulating resin layer-provided substrate was washed with water and dipped in a "CUST-201 plating liquid" (a trade name, manufactured by Hitachi Chemical Co., Ltd.) as an electroless copper plating liquid at room temperature for minutes. Subsequently, the insulating resin layer-provided substrate was further subjected to electroplating with copper sulfate. Thereafter, annealing was performed at 170° C. for 30 minutes to forma conductor layer having a thickness of 20 μm on the surface of the insulating resin layer.

For the purpose of performing etching removal of an unnecessary area of the plated conductor layer, an oxide film on the copper surface was removed by means of polishing with a #600 buff roll. Thereafter, an etching resist was formed and subjected to etching, and the etching resist was then removed. There was thus formed a second, circuit layer connected to the foregoing first circuit layer via the foregoing via holes.

(11) Fabrication of Multi-Layered Wiring Board:

Furthermore, for the purpose of multi-layering, the surface of the second circuit layer was dipped in an aqueous solution containing 50 g/L of sodium chlorite, 20 g/L of NaOH, and 10 g/L of trisodium phosphate at 85° C. for 20 minutes and then washed with water, followed by drying at 80° C. for 20 minutes, thereby forming irregularities of copper oxide on the surface of the second circuit layer.

Subsequently, the foregoing steps (4) to (10) were repeated to fabricate a multi-layered wiring board of three layers.

Example 13

(1) Fabrication of Copper Clad Laminate:

An insulating resin composition shown in Table 2 was coated on a profile-free copper foil (a trade name: HLN-18, manufactured by Nippon Denkai, Ltd., thickness: 18 μm) as a support and subjected to a drying treatment at 100° C. for 10 minutes, thereby fabricating a copper foil-provided insulating resin layer of 10±1 μm.

Subsequently, four sheets of prepregs (thickness: 0.1 mm) used in MCL-E-67 (a trade name), manufactured by Hitachi Chemical Co., Ltd. were superimposed, and two sheets of the foregoing copper foil-provided insulating resin layers were disposed on the upper and lower sides of the prepreg such that the insulating resin layer side came into contact with the prepreg, followed by lamination and deformation at a temperature of 185° C. under a pressure of 3.5 MPa for one hour to obtain a copper clad laminate.

(2) Formation of Through-Hole:

Subsequently, boring processing with 2,000 holes was performed using a drill having a diameter of 0.105 mm (a trade name: KMD J464, manufactured by Union Tool Co.) under a condition at a rotation number of 300 krpm, a feed speed of 2.1 m/min, and a chip load of 7.0 μm/rev. There were thus formed through-holes penetrating from the front surface to the back surface of the foregoing copper clad laminate.

(3) Desmearing Treatment:

In order to chemically roughen the smear within the foregoing through-hole, an aqueous solution containing 200 mL/L of diethylene glycol monobutyl ether and 5 g/L of NaOH as a swelling liquid was heated to 80° C., and the copper clad laminate was dipped therein for 5 minutes. Subsequently, an aqueous solution containing 60 g/L of $KMnO_4$ and 40 g/L of NaOH as a desmearing treatment liquid was heated to 80° C., and the copper clad laminate was dipped therein for 20 minutes. Subsequently, the resulting copper clad laminate was dipped in an aqueous solution of a neutralizing liquid ($SnCl_2$: 30 g/L, $H_2SO_4$ having a concentration of 98% by mass: 300 mL/L) at room temperature for 5 minutes, thereby achieving neutralization. Thereafter, the copper clad laminate was washed with water for 5 minutes and then dried at 100° C. for 10 minutes.

(4) Support Removal Treatment:

Subsequently, the support (copper foil as the outermost layer) was entirely removed by means of etching.

(5) Ultraviolet Ray Irradiation:

The foregoing insulating resin-provided substrate was irradiated with ultraviolet rays at 3,000 $mJ/cm^2$ by treating with a conveyor type ultraviolet ray irradiation apparatus with a metal halide lamp as the lamp (wavelength: 350 to 380 nm).

(6) Formation of Conductor Layer:

As a pre-treatment of electroless plating, each of the surfaces of the insulating resin layers of two layers in total, which were formed on the upper surface side and the lower surface side of the foregoing insulating resin layer-provided substrate, was dipped in a conditioner liquid "CLC-601" (a trade name, manufactured by Hitachi Chemical Co., Ltd.) at 60° C. for 5 minutes. Thereafter, the resulting insulating resin layer-provided substrate was washed with water and dipped in a pre-dipping liquid "PD-201" (a trade name, manufactured by Hitachi Chemical Co., Ltd.) at room temperature for 2 minutes. Subsequently, the insulating resin layer-provided substrate was subjected to a dipping treatment with "HS-202B" (a trade name, manufactured by Hitachi Chemical Co., Ltd.) as an electroless plating catalyst containing $PdCl_2$ at room temperature for 10 minutes, and thereafter, the resulting insulating resin layer-provided substrate was washed with water and dipped in a "CUST-201 plating liquid" (a trade name, manufactured by Hitachi Chemical Co., Ltd.) as an electroless copper plating liquid at room temperature for 15 minutes. Subsequently, the insulating resin layer-provided substrate was further subjected to electroplating with copper sulfate. Thereafter, annealing was performed at 170° C. for 30 minutes to form a conductor layer having a thickness of 20 μm on each of the surfaces of the insulating resin layers of two layers on the upper surface side and the lower surface side.

(7) Formation of Circuit Layer:

For the purpose of performing etching removal of an unnecessary area of each of the foregoing conductor layers of two layers, an oxide film on the copper surface was removed by means of polishing with a #600 buff roll. Thereafter, an etching resist was formed and subjected to etching, and the etching resist was then removed. There was thus formed a circuit layer connected to the internal copper foil via the foregoing through-holes.

There was thus fabricated a wiring board.

Examples 14 to 17

Multi-layered wiring boards were fabricated by following the same operations as those in Example 12, except that in Example 12, the composition of the insulating resin composition was changed as shown in Table 2.

Example 18

A multi-layered wiring board was fabricated by following the same operations as those in Example 12, except that in Example 12, an insulating resin composition in which spherical silica "SO-25R" (a trade name, manufactured by Admatechs Company Limited) having an average particle diameter of 0.5 μm was used as the inorganic filler as shown in Table 2 was used; and that the composition of the insulating resin composition was changed as shown in Table 2.

Example 19

A multi-layered wiring board was fabricated by following the same operations as those in Example 12, except that in Example 12, the lamp for ultraviolet ray irradiation was changed to a conveyor type ultraviolet ray irradiation apparatus with a high pressure mercury vapor lamp (maximum wavelength: 310 to 370 nm). Incidentally, similar to Example 12, the ultraviolet rays were irradiated in an amount of light of 3,000 $mJ/cm^2$.

Comparative Example 4

A multi-layered wiring board was fabricated in the same manner as that in Example 12, except that the order of the desmearing treatment (7) and the support removal treatment (8) was reversed.

Comparative Example 5

A wiring board was fabricated in the same manner as that in Example 13, except that the order of the desmearing treatment (3) and the support removal treatment (4) was reversed.

Comparative Example 6

A wiring board was fabricated by following the same operations as those in Example 13, except that the ultraviolet ray irradiation (5) was not performed.

TABLE 2

|  | Component (A) (parts by mass) | Component (B) (parts by mass) | Component (C) (parts by mass) | Solvent (parts by mass) | Filler (parts by mass) |
|---|---|---|---|---|---|
| Example 12 | A1<br>49 | B1<br>27 | C1<br>0.15 | D1<br>40 | — |
| Example 13 | A1<br>49 | B1<br>27 | C1<br>0.15 | D1<br>120 | — |
| Example 14 | A1 + A2<br>80 + 20 | B1<br>68 | C1<br>0.3 | D1<br>90 | — |
| Example 15 | A1 + A2<br>33 + 57 | B1<br>86 | C1<br>0.3 | D1<br>95 | — |
| Example 16 | A1<br>126 | B1 + B2<br>38 + 17 | C1<br>0.38 | D1<br>40 | — |
| Example 17 | A1<br>145 | B1 + B2<br>13 + 36 | C1<br>0.43 | D1<br>130 | — |
| Example 18 | A1<br>49 | B1<br>27 | C1<br>0.15 | D1<br>60 | E1<br>33 |
| Example 19 | A1<br>49 | B1<br>27 | C1<br>0.15 | D1<br>40 | — |

TABLE 2-continued

| | Component (A) (parts by mass) | Component (B) (parts by mass) | Component (C) (parts by mass) | Solvent (parts by mass) | Filler (parts by mass) |
|---|---|---|---|---|---|
| Comparative Example 4 | A1 49 | B1 27 | C1 0.15 | D1 40 | — |
| Comparative Example 5 | A1 49 | B1 27 | C1 0.15 | D1 120 | — |
| Comparative Example 6 | A1 49 | B1 27 | C1 0.15 | D1 120 | — |

A1: Epoxy resin having hexanediol as a skeleton thereof, as manufactured by the foregoing method
A2: Phenol novolak type epoxy resin, "N-770" (manufactured by DIC Corporation)
B1: Active ester group-containing compound, "EXB-9460S" (manufactured by DIC Corporation)
B2: Cresol novolak type phenol resin, "KA-1165" (manufactured by DIC Corporation)
C1: Curing accelerator, imidazole derivative compound, 1-cyanoethyl-2-phenylimidazolium trimellitate, "2PZ-CNS" (manufactured by Shikoku Chemicals Corporation)
D1: Methyl ethyl ketone
E1: Inorganic filler, spherical silica having an average particle diameter of 0.5 μm, "SO-25R" (manufactured by Admatechs Company Limited)

The thus fabricated multi-layered wiring boards were tested with respect to the adhesive strength to outer layer circuit, the roughness of insulating resin of plated copper etching removed surface, and the solder heat resistance at 288° C. Results thereof are shown in Table 3.

TABLE 3

| | Adhesive strength to outer layer circuit [90-degree peeling] (kN/m) | Roughness of insulating resin layer of plated copper etching removed surface [Ra] (μm) | Solder heat resistance at 288° C. [immediately after fabrication of test piece] (sec) |
|---|---|---|---|
| Example 12 | 0.7 | Not more than 0.05 | >60 |
| Example 13 | 0.7 | Not more than 0.05 | >60 |
| Example 14 | 0.8 | Not more than 0.05 | >60 |
| Example 15 | 0.8 | Not more than 0.05 | >60 |
| Example 16 | 0.8 | Not more than 0.05 | >60 |
| Example 17 | 0.7 | Not more than 0.05 | >60 |
| Example 18 | 0.7 | Not more than 0.05 | >60 |
| Example 19 | 0.9 | Not more than 0.05 | >60 |
| Comparative Example 20 | 0.8 | 0.15 to 0.2 | >60 |
| Comparative Example 21 | 0.8 | 0.15 to 0.2 | >60 |
| Comparative Example 22 | 0.2 | 0.05 to 0.1 | <1 |

As shown in Table 3, in Examples 12 to 19, the surface of the insulating resin layer was protected by the support at the time of the desmearing treatment within the via hole, and thereafter, the support was removed, and therefore, the occurrence of an increase of the irregularities on the surface of the insulating resin layer could be prevented. In addition, in Examples 12 to 19, nevertheless the roughening of the surface of the insulating resin layer at the time of the desmearing treatment was omitted in this way, the adhesive force to the wiring was revealed by irradiating ultraviolet rays on the surface of the insulating resin layer, and therefore, the adhesive strength between this insulating resin layer surface and the wiring circuit was excellent. In particular, in Examples 12 to 19, the solder heat resistance was excellent.

On the other hand, in Comparative Examples 4 and 5, the desmearing treatment was performed in a state where the support on the surface of the insulating resin layer was removed, and therefore, the surface roughness of the insulating resin layer was large.

In Comparative Example 6, the ultraviolet ray irradiation was not performed, and therefore, the adhesive strength between the insulating resin layer and the wiring circuit was low, and the solder heat resistance was poor.

Example 20

The same operations as those in Example 12 were followed, except that the ultraviolet ray irradiation was performed after the formation of via holes and before the desmearing treatment.

Example 21

(1) Fabrication of Laminate:

An insulating resin composition shown in Table 4 was coated on a supporting plate made of a polyethylene naphthalate (PEN) film (thickness: 50 μm) as a support and subjected to a drying treatment at 100° C. for 10 minutes, thereby fabricating an insulating resin layer of 10±1 μm.

Subsequently, four sheets of prepregs (thickness: 0.1 mm) used in MCL-E-67 (a trade name), manufactured by Hitachi Chemical Co., Ltd. were superimposed, and two sheets of the foregoing PEN film-provided insulating resin layers were disposed on the upper and lower sides of the prepreg such that the insulating resin layer side came into contact with the prepreg, followed by lamination and deformation at a temperature of 185° C. under a pressure of 3.5 MPa for one hour to obtain a laminate.

(2) Formation of Through-Hole:

Subsequently, boring processing with 2,000 holes was performed using a drill having a diameter of 0.105 mm (a trade name: KMD J464, manufactured by Union Tool Co.) under a condition at a rotation number of 300 krpm, a feed speed of 2.1 m/min, and a chip load of 7.0 μm/rev. There were thus formed through-holes penetrating from the front surface to the back surface of the foregoing laminate.

(3) Ultraviolet Ray Irradiation:

The foregoing insulating resin-provided substrate was irradiated with ultraviolet rays at 3,000 mJ/cm$^2$ by treating with a conveyor type ultraviolet ray irradiation apparatus with a metal halide lamp as the lamp (wavelength: 350 to 380 nm).

(4) Desmearing Treatment:

In order to chemically roughen the smear within the foregoing through-hole, an aqueous solution containing 200 mL/L of diethylene glycol monobutyl ether and 5 g/L of NaOH, as a swelling liquid was heated to 80° C., and the insulating resin layer-provided substrate was dipped therein for 5 minutes. Subsequently, an aqueous solution containing 60 g/L of KMnO$_4$ and 40 g/L of NaOH as a desmearing treatment liquid was heated to 80° C., and the insulating resin layer-provided substrate was dipped therein for 20 minutes. Subsequently, the resulting insulating resin layer-provided substrate was dipped in an aqueous solution of a neutralizing liquid (SnCl$_2$: 30 g/L, H$_2$SO$_4$ having a concentration of 98% by mass: 300 mL/L) at room temperature for 5 minutes, thereby achieving neutralization. Thereafter, the insulating resin layer-provided substrate was washed with water for 5 minutes and then dried at 100° C. for 10 minutes.

(5) Support Removal Treatment:

Subsequently, the support (PEN film) was peeled and removed from the insulating resin composition.

(6) Formation of Conductor Layer:

As a pre-treatment of electroless plating, each of the surfaces of the insulating resin layers of two layers in total, which were formed on the upper surface side and the lower surface side of the foregoing insulating resin layer-provided substrate, was dipped in a conditioner liquid "CLC-601" (a trade name, manufactured by Hitachi Chemical Co., Ltd.) at 60° C. for 5 minutes. Thereafter, the resulting insulating resin layer-provided substrate was washed with water and dipped in a pre-dipping liquid "PD-201" (a trade name, manufactured by Hitachi Chemical Co., Ltd.) at room temperature for 2 minutes. Subsequently, the insulating resin layer-provided substrate was subjected to a dipping treatment with "HS-202B" (a trade name, manufactured by Hitachi Chemical Co., Ltd.) as an electroless plating catalyst containing $PdCl_2$ at room temperature for 10 minutes, and thereafter, the resulting insulating resin layer-provided substrate was washed with water and dipped in a "CUST-201 plating liquid" (a trade name, manufactured by Hitachi Chemical Co., Ltd.) as an electroless copper plating liquid at room temperature for 15 minutes. Subsequently, the insulating resin layer-provided substrate was further subjected to electroplating with copper sulfate. Thereafter, annealing was performed at 170° C. for 30 minutes to form a conductor layer having a thickness of 20 μm on each of the surfaces of the insulating resin layers of two layers on the upper surface side and the lower surface side.

(7) Formation of Circuit Layer:

For the purpose of performing etching removal of an unnecessary area of each of the foregoing conductor layers of two layers, an oxide film on the copper surface was removed by means of polishing with a #600 buff roll. Thereafter, an etching resist was formed and subjected to etching, and the etching resist was then removed. There was thus formed a circuit layer connected to the internal copper foil via the foregoing through-holes.

There was thus fabricated a wiring board.

Examples 22 to 25

Multi-layered wiring boards were fabricated by following the same operations as those in Example 20, except that in Example 20, the composition of the insulating resin composition was changed as shown in Table 4.

Example 26

A multi-layered wiring board was fabricated by following the same operations as those in Example 20, except that in Example 20, an insulating resin composition in which spherical silica "SO-25R" (a trade name, manufactured by Admatechs Company Limited) having an average particle diameter of 0.5 μm was used as the inorganic filler as shown in Table 4 was used; and that the composition of the insulating resin composition was changed as shown in Table 4.

Example 27

A multi-layered wiring board was fabricated by following the same operations as those in Example 20, except that in Example 20, the lamp for ultraviolet ray irradiation was changed to a conveyor type ultraviolet ray irradiation apparatus with a high pressure mercury vapor lamp (maximum wavelength: 310 to 370 nm). Incidentally, similar to Example 20, the ultraviolet rays were irradiated in an amount of light of 3,000 $mJ/cm^2$.

Comparative Example 7

A multi-layered wiring board was fabricated in the same manner as that in Example 20, except that the order of the desmearing treatment (8) and the support removal treatment (9) was reversed.

Comparative Example 8

A wiring board was fabricated in the same manner as that in Example 21, except that the order of the desmearing treatment (4) and the support removal treatment (5) was reversed.

Comparative Example 9

A wiring board was fabricated by following the same operations as those in Example 21, except that the ultraviolet ray irradiation (3) was not performed.

TABLE 4

| | Component (A) (parts by mass) | Component (B) (parts by mass) | Component (C) (parts by mass) | Solvent (parts by mass) | Filler (parts by mass) |
|---|---|---|---|---|---|
| Example 20 | A1 49 | B1 27 | C1 0.15 | D1 40 | — |
| Example 21 | A1 49 | B1 27 | C1 0.15 | D1 120 | — |
| Example 22 | A1 + A2 80 + 20 | B1 68 | C1 0.3 | D1 90 | — |
| Example 23 | A1 + A2 33 + 57 | B1 86 | C1 0.3 | D1 95 | — |
| Example 24 | A1 126 | B1 + B2 38 + 17 | C1 0.38 | D1 40 | — |
| Example 25 | A1 145 | B1 + B2 13 + 36 | C1 0.43 | D1 130 | — |
| Example 26 | A1 49 | B1 27 | C1 0.15 | D1 60 | E1 33 |
| Example 27 | A1 49 | B1 27 | C1 0.15 | D1 40 | — |
| Comparative Example 7 | A1 49 | B1 27 | C1 0.15 | D1 40 | — |
| Comparative Example 8 | A1 49 | B1 27 | C1 0.15 | D1 120 | — |
| Comparative Example 9 | A1 49 | B1 27 | C1 0.15 | D1 120 | — |

A1: Epoxy resin having hexanediol as a skeleton thereof, as manufactured by the foregoing method
A2: Phenol novolak type epoxy resin, "N-770" (manufactured by DIC Corporation)
B1: Active ester group-containing compound, "EXB-9460S" (manufactured by DIC Corporation)
B2: Cresol novolak type phenol resin, "KA-1165" (manufactured by DIC Corporation)
C1: Curing accelerator, imidazole derivative compound, 1-cyanoethyl-2-phenylimidazolium trimellitate, "2PZ-CNS" (manufactured by Shikoku Chemicals Corporation)
D1: Methyl ethyl ketone
E1: Inorganic filler, spherical silica having an average particle diameter of 0.5 μm, "SO-25R" (manufactured by Admatechs Company Limited)

The thus fabricated multi-layered wiring boards were tested with respect to the adhesive strength to outer layer circuit, the roughness of insulating resin of plated copper etching removed surface, and the solder heat resistance at 288° C. Results thereof are shown in Table 5.

TABLE 5

| | Adhesive strength to outer layer circuit [90-degree peeling] (kN/m) | Roughness of insulating resin layer of plated copper etching removed surface [Ra] (μm) | Solder heat resistance at 288° C. [immediately after fabrication of test piece] (sec) |
|---|---|---|---|
| Example 20 | 0.7 | Not more than 0.05 | >60 |
| Example 21 | 0.7 | Not more than 0.05 | >60 |
| Example 22 | 0.8 | Not more than 0.05 | >60 |
| Example 23 | 0.8 | Not more than 0.05 | >60 |
| Example 24 | 0.8 | Not more than 0.05 | >60 |
| Example 25 | 0.7 | Not more than 0.05 | >60 |
| Example 26 | 0.7 | Not more than 0.05 | >60 |
| Example 27 | 0.9 | Not more than 0.05 | >60 |
| Comparative Example 7 | 0.8 | 0.15 to 0.2 | >60 |
| Comparative Example 8 | 0.8 | 0.15 to 0.2 | >60 |
| Comparative Example 9 | 0.2 | 0.05 to 0.1 | <1 |

As shown in Table 5, in Examples 20 to 27, the surface of the insulating resin layer was protected by the support at the time of the desmearing treatment within the via hole, and thereafter, the support was removed, and therefore, the roughness (Ra) of the surface of the insulating resin layer was all not more than 0.05, and the occurrence of an increase of the irregularities could be prevented. In addition, in Examples 20 to 27, nevertheless the roughening of the surface of the insulating resin layer at the time of the desmearing treatment was omitted in this way, the adhesive force to the wiring was revealed by irradiating ultraviolet rays on the surface of the insulating resin layer, and therefore, the adhesive strength between this insulating resin layer surface and the wiring circuit was excellent. In particular, in Examples 20 to 27, the solder heat resistance was excellent.

On the other hand, in Comparative Examples 7 and 8, the desmearing treatment was performed in a state where the support on the surface of the insulating resin layer was removed, and therefore, the surface roughness of the insulating resin layer was large.

In Comparative Example 9, the ultraviolet ray irradiation was not performed, and therefore, the adhesive strength between the insulating resin layer and the wiring circuit was low, and the solder heat resistance was poor.

Example 28

The same operations as those in Example 12 were followed, except that the ultraviolet ray irradiation was performed after the desmearing treatment and before the support removal treatment; and that the dipping treatment time of the insulating resin layer-provided substrate in the desmearing treatment liquid at the time of the desmearing treatment was changed to 10 minutes.

Example 29

The same operations as those in Example 21 were followed, except that the ultraviolet ray irradiation was performed after the desmearing treatment and before the support removal treatment; and that the dipping treatment time of the laminate in the desmearing treatment liquid at the time of the desmearing treatment was changed to 10 minutes.

Examples 30 to 33

Multi-layered wiring boards were fabricated by following the same operations as those in Example 28, except that in Example 28, the composition of the insulating resin composition was changed as shown in Table 6.

Example 34

A multi-layered wiring board was fabricated by following the same operations as those in Example 28, except that in Example 28, an insulating resin composition in which spherical silica "SO-25R" (a trade name, manufactured by Admatechs Company Limited) having an average particle diameter of 0.5 μm was used as the inorganic filler as shown in Table 6 was used; and that the composition of the insulating resin composition was changed as shown in Table 6.

Example 35

A multi-layered wiring board was fabricated by following the same operations as those in Example 28, except that in Example 28, the lamp for ultraviolet ray irradiation was changed to a conveyor type ultraviolet ray irradiation apparatus with a high pressure mercury vapor lamp (wavelength: 310 to 370 nm). Incidentally, similar to Example 27, the ultraviolet rays were irradiated in, an amount of light of 3,000 mJ/cm$^2$.

Comparative Example 10

A multi-layered wiring board was fabricated in the same manner as that in Example 28, except that the support removal treatment (9) was performed after the formation of via hole (6) and before the desmearing treatment.

Comparative Example 11

A multi-layered wiring board was fabricated in the same manner as that in Example 29, except that the support removal treatment (5) was performed after the formation of through-hole (2) and before the desmearing treatment (3).

Comparative Example 12

A wiring board was fabricated by following the same operations as those in Example 29, except that the ultraviolet ray irradiation (4) was not performed.

TABLE 6

| | Component (A) (parts by mass) | Component (B) (parts by mass) | Component (C) (parts by mass) | Solvent (parts by mass) | Filler (parts by mass) |
|---|---|---|---|---|---|
| Example 28 | A1<br>49 | B1<br>27 | C1<br>0.15 | D1<br>40 | — |
| Example 29 | A1<br>49 | B1<br>27 | C1<br>0.15 | D1<br>120 | — |
| Example 30 | A1 + A2<br>80 + 20 | B1<br>68 | C1<br>0.3 | D1<br>90 | — |
| Example 31 | A1 + A2<br>33 + 57 | B1<br>86 | C1<br>0.3 | D1<br>95 | — |
| Example 32 | A1<br>126 | B1 + B2<br>38 + 17 | C1<br>0.38 | D1<br>40 | — |
| Example 33 | A1<br>145 | B1 + B2<br>13 + 36 | C1<br>0.43 | D1<br>130 | — |

TABLE 6-continued

|  | Component (A) (parts by mass) | Component (B) (parts by mass) | Component (C) (parts by mass) | Solvent (parts by mass) | Filler (parts by mass) |
|---|---|---|---|---|---|
| Example 34 | A1 49 | B1 27 | C1 0.15 | D1 60 | E1 33 |
| Example 35 | A1 49 | B1 27 | C1 0.15 | D1 40 | — |
| Comparative Example 10 | A1 49 | B1 27 | C1 0.15 | D1 40 | — |
| Comparative Example 11 | A1 49 | B1 27 | C1 0.15 | D1 120 | — |
| Comparative Example 12 | A1 49 | B1 27 | C1 0.15 | D1 120 | — |

A1: Epoxy resin having hexanediol as a skeleton thereof, as manufactured by the foregoing method
A2: Phenol novolak type epoxy resin, "N-770" (manufactured by DIC Corporation)
B1: Active ester group-containing compound, "EXB-9460S" (manufactured by DIC Corporation)
B2: Cresol novolak type phenol resin, "KA-1165" (manufactured by DIC Corporation)
C1: Curing accelerator, imidazole derivative compound, 1-cyanoethyl-2-phenylimidazolium trimellitate, "2PZ-CNS" (manufactured by Shikoku Chemicals Corporation)
D1: Methyl ethyl ketone
E1: Inorganic filler, spherical silica having an average particle diameter of 0.5 μm, "SO-25R" (manufactured by Admatechs Company Limited)

The thus fabricated multi-layered wiring boards were tested with respect to the adhesive strength to outer layer circuit, the roughness of insulating resin of plated copper etching removed surface, and the solder heat resistance at 288° C. Results thereof are shown in Table 7.

TABLE 7

|  | Adhesive strength to outer layer circuit [90-degree peeling] (kN/m) | Roughness of insulating resin layer of plated copper etching removed surface [Ra] (μm) | Solder heat resistance at 288° C. [immediately after fabrication of test piece] (sec) |
|---|---|---|---|
| Example 28 | 0.7 | Not more than 0.05 | >60 |
| Example 29 | 0.7 | Not more than 0.05 | >60 |
| Example 30 | 0.8 | Not more than 0.05 | >60 |
| Example 31 | 0.8 | Not more than 0.05 | >60 |
| Example 32 | 0.8 | Not more than 0.05 | >60 |
| Example 33 | 0.7 | Not more than 0.05 | >60 |
| Example 34 | 0.7 | Not more than 0.05 | >60 |
| Example 35 | 0.9 | Not more than 0.05 | >60 |
| Comparative Example 10 | 0.8 | 0.15 to 0.2 | >60 |
| Comparative Example 11 | 0.8 | 0.15 to 0.2 | >60 |
| Comparative Example 12 | 0.2 | 0.05 to 0.1 | <1 |

As shown in Table 7, in Examples 28 to 35, the surface of the insulating resin layer was protected by the support at the time of the desmearing treatment within the via hole, and thereafter, the support was removed, and therefore, the roughness (Ra) of the surface of the insulating resin layer was all not more than 0.05, and the occurrence of an increase of the irregularities could be prevented. In addition, in Examples 28 to 35, nevertheless the roughening of the surface of the insulating resin layer at the time of the desmearing treatment was omitted in this way, the adhesive force to the wiring was revealed by irradiating ultraviolet rays on the surface of the insulating resin layer, and therefore, the adhesive strength between this insulating resin layer surface and the wiring circuit was excellent. In particular, in Examples 28 to 35, the solder heat resistance was excellent.

On the other hand, in Comparative Examples 10 and 11, the desmearing treatment was performed in a state where the support on the surface of the insulating resin layer was removed, and therefore, the surface roughness of the insulating resin layer was large.

In Comparative Example 12, the ultraviolet ray irradiation was not performed, and therefore, the adhesive strength between the insulating resin layer and the wiring circuit was low, and the solder heat resistance was poor.

EXPLANATIONS OF LETTERS OR NUMERALS

1: First wiring circuit
2: Substrate
3: Second wiring circuit
4: Insulating resin layer
5: Third wiring circuit
6: Via hole
7: Through-hole
9: Support
10: Wiring board
20: Wiring board
21: Prepreg laminate

What is claimed is:

1. A laminate comprising an insulating resin layer and a support wherein the insulating resin layer comprises a cured resin product obtained by thermally curing a resin composition and irradiating with ultraviolet rays, and the resin composition containing (A) one or more epoxy resins selected from a cresol novolak type epoxy resin, a phenol novolak type epoxy resin, a naphthol novolak type epoxy resin, a bisphenol A type epoxy resin, a bisphenol F type epoxy resin, a bisphenol S type epoxy resin, a bisphenol T type epoxy resin, a bisphenol Z type epoxy resin, a tetrabromobisphenol A type epoxy resin, a biphenyl type epoxy resin, a biphenyl aralkyl type epoxy resin, a tetramethylbiphenyl type epoxy resin, a naphthol aralkyl type epoxy resin, a naphthalenediol aralkyl type epoxy resin and a fluorene type epoxy resin, the one or more epoxy resins having two or more epoxy groups in one molecule thereof and having a structural unit derived from an alkylene glycol having a carbon number of from 3 to 10 in a main chain thereof, (B) an ultraviolet ray active ester group-containing compound, and (C) an epoxy resin curing accelerator.

2. The laminate according to claim 1, wherein the irradiation with ultraviolet rays is performed using an ultraviolet ray lamp capable of emitting radiation at a maximum wavelength in the range of from 300 to 450 nm in an amount of light of from about 1,000 to 5,000 mJ/cm$^2$ under an atmospheric pressure atmosphere.

3. The laminate according to claim 1, wherein the alkylene glycol having a carbon number of from 3 to 10 is hexanediol.

4. The laminate according to claim 1, wherein an ester equivalent of the ultraviolet ray active ester group-containing compound (B) is from 0.75 to 1.25 equivalents relative to one epoxy equivalent of the one or more epoxy resins (A).

5. The laminate according to claim 1, wherein the ultraviolet ray active ester group-containing compound (B) is a resin having one or more ester groups in one molecule thereof.

6. The laminate according to claim 1, wherein the (C) epoxy resin curing accelerator is imidazole based compound.

7. The laminate according to claim 1, wherein a surface roughness Ra of the support is not more than 0.12 μm.

8. The laminate according to claim 1, wherein the support is a synthetic resin film.

9. The laminate according to claim 1, wherein the surface of the insulating resin layer contacts the surface of the support.

10. The laminate according to claim 1, wherein (B) contains two or more different ultraviolet ray active ester group-containing compounds.

11. A wiring board obtained by disposing the laminate according to claim 1 on a substrate having a circuit of a wiring conductor and forming a wiring on the cured resin layer by plating.

12. The wiring board according to claim 11, wherein the irradiation with ultraviolet rays is performed using an ultraviolet ray lamp capable of emitting radiation at a maximum wavelength in the range of from 300 to 450 nm in an amount of light of from about 1,000 to 5,000 mJ/cm$^2$ under an atmospheric pressure atmosphere.

13. A laminate comprising an insulating resin layer containing a resin composition and a prepreg laminate such that the insulating resin layer and the surface of the prepreg laminate are in contact with each other,
the resin composition containing (A) one or more epoxy resins selected from a cresol novolak type epoxy resin, a phenol novolak type epoxy resin, a naphthol novolak type epoxy resin, a bisphenol A type epoxy resin, a bisphenol F type epoxy resin, a bisphenol S type epoxy resin, a bisphenol T type epoxy resin, a bisphenol Z type epoxy resin, a tetrabromobisphenol A type epoxy resin, a biphenyl type epoxy resin, a biphenyl aralkyl type epoxy resin, a tetramethylbiphenyl type epoxy resin, a naphthol aralkyl type epoxy resin, a naphthalenediol aralkyl type epoxy resin and a fluorene type epoxy resin, the one or more epoxy resins having two or more epoxy groups in one molecule thereof and having a structural unit derived from an alkylene glycol having a carbon number of from 3 to 10 in a main chain thereof, (B) an ultraviolet ray active ester group-containing compound, and (C) an epoxy resin curing accelerator.

14. The laminate according to claim 13, wherein the alkylene glycol having a carbon number of from 3 to 10 is hexanediol.

15. The laminate according to claim 13, wherein an ester equivalent of the ultraviolet ray active ester group-containing compound (B) is from 0.75 to 1.25 equivalents relative to one epoxy equivalent of the one or more epoxy resins (A).

16. The laminate according to claim 13, wherein the ultraviolet ray active ester group-containing compound (B) is a resin having one or more ester groups in one molecule thereof.

17. The laminate according to claim 13, wherein (B) contains two or more different ultraviolet ray active ester group-containing compounds.

18. A support-provided insulating resin layer comprising an insulating resin layer containing a resin composition containing one or more epoxy resins selected from a cresol novolak type epoxy resin, a phenol novolak type epoxy resin, a naphthol novolak type epoxy resin, a bisphenol A type epoxy resin, a bisphenol F type epoxy resin, a bisphenol S type epoxy resin, a bisphenol T type epoxy resin, a bisphenol Z type epoxy resin, a tetrabromobisphenol A type epoxy resin, a biphenyl type epoxy resin, a biphenyl aralkyl type epoxy resin, a tetramethylbiphenyl type epoxy resin, a naphthol aralkyl type epoxy resin, a naphthalenediol aralkyl type epoxy resin and a fluorene type epoxy resin, the one or more epoxy resins having two or more epoxy groups in one molecule thereof and having a structural unit derived from an alkylene glycol having a carbon number of from 3 to 10 in a main chain thereof, an ultraviolet ray active ester group-containing compound, and an epoxy resin curing accelerator; and a support.

19. The support-provided insulating resin layer according to claim 18, wherein the resin composition contains two or more different ultraviolet ray active ester group-containing compounds.

* * * * *